United States Patent
Bito

(10) Patent No.: US 8,587,027 B2
(45) Date of Patent: Nov. 19, 2013

(54) FIELD EFFECT TRANSISTOR, METHOD OF MANUFACTURING THE SAME, AND SEMICONDUCTOR DEVICE

(75) Inventor: Yasunori Bito, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 539 days.

(21) Appl. No.: 12/457,551

(22) Filed: Jun. 15, 2009

(65) Prior Publication Data

US 2010/0001318 A1    Jan. 7, 2010

(30) Foreign Application Priority Data

Jul. 2, 2008  (JP) .................................. 2008-173286

(51) Int. Cl.
*H01L 21/318* (2006.01)
(52) U.S. Cl.
USPC ..... 257/192; 257/110; 257/550; 257/E29.317
(58) Field of Classification Search
USPC ......... 257/110, 279, 458, 461–464, 509, 525, 257/544–550, 656, 927, 928, 637, E29.317, 257/192, 287, 504, E27.148, E29.265, 465, 257/638, 329.317; 438/167, 208, 912
See application file for complete search history.

(56) References Cited

U.S. PATENT DOCUMENTS

| | | | |
|---|---|---|---|
| 4,716,128 A | * | 12/1987 | Schubert et al. .............. 438/294 |
| 4,797,718 A | * | 1/1989 | Schubert ....................... 257/387 |
| 4,845,046 A | * | 7/1989 | Shimbo ......................... 438/186 |
| 6,166,404 A | | 12/2000 | Imoto et al. |

(Continued)

FOREIGN PATENT DOCUMENTS

CN    1507074 A    6/2004
CN    1757120 A    4/2006

(Continued)

OTHER PUBLICATIONS

Chinese Office Action dated Dec. 19, 2011 with English translation.

(Continued)

*Primary Examiner* — Cuong Q Nguyen
*Assistant Examiner* — Yosef Gebreyesus
(74) *Attorney, Agent, or Firm* — McGinn Intellectual Property Law Group, PLLC

(57) ABSTRACT

A J-FET includes a channel layer of a first conductivity type (a Si-doped n-type AlGaAs electron supply layers 3 and 7, undoped AlGaAs spacer layers 4 and 6, and an undoped InGaAs channel layer 5) formed above a semi-insulating GaAs substrate, an upper semiconductor layer made up of at least one semiconductor layer and formed above the channel layer of the first conductivity type, a semiconductor layer of a second conductivity type (C-doped $p^+$-GaAs layer 18) formed in a recess made in the upper semiconductor layer or formed above the upper semiconductor layer, a gate electrode placed above and in contact with the semiconductor layer of the second conductivity type, and a gate insulating film including a nitride film formed above and in contact with the upper semiconductor layer and an oxide film formed above the nitride film and having a larger thickness than the nitride film.

18 Claims, 17 Drawing Sheets

(56) References Cited

U.S. PATENT DOCUMENTS

| | | | | |
|---|---|---|---|---|
| 6,867,078 | B1* | 3/2005 | Green et al. | 438/167 |
| 7,456,444 | B2 | 11/2008 | Bito | |
| 7,910,955 | B2* | 3/2011 | Endoh et al. | 257/194 |
| 8,338,861 | B2* | 12/2012 | Briere et al. | 257/194 |
| 2003/0087496 | A1* | 5/2003 | Beasom | 438/304 |
| 2004/0104404 | A1* | 6/2004 | Bito | 257/192 |
| 2005/0161705 | A1* | 7/2005 | Kobayashi | 257/194 |
| 2006/0043415 | A1* | 3/2006 | Okamoto et al. | 257/192 |
| 2007/0045663 | A1 | 3/2007 | Bito | |
| 2008/0206974 | A1* | 8/2008 | Simin et al. | 438/586 |
| 2008/0237606 | A1* | 10/2008 | Kikkawa et al. | 257/76 |
| 2009/0130810 | A1* | 5/2009 | Chaudhry et al. | 438/269 |

FOREIGN PATENT DOCUMENTS

| | | |
|---|---|---|
| JP | 8-274115(A) | 10/1996 |
| JP | 9-186174(A) | 7/1997 |
| JP | 2000-196029(A) | 7/2000 |
| JP | 2000-323495 | 11/2000 |
| JP | 2000-349244(A) | 12/2000 |
| JP | 2001-210658(A) | 8/2001 |
| JP | 2007-27594 | 2/2007 |

OTHER PUBLICATIONS

Japanese Notification of Reasons for Refusal dated May 7, 2013 with English translation thereof.

* cited by examiner

FIELD EFFECT TRANSISTOR, METHOD OF MANUFACTURING THE SAME, AND SEMICONDUCTOR DEVICE

BACKGROUND OF THE INVENTION

1. Field of the Invention

The present invention relates to a field effect transistor, a method of manufacturing the same and a semiconductor device and, particularly, to a p-n junction gate field effect transistor using a p-type semiconductor layer as a gate.

2. Description of Related Art

A junction field effect transistor (J-FET) using a p-type semiconductor layer as a gate has a higher gate forward turn-on voltage than a GaAs field effect transistor having a Schottky gate electrode. Thus, a J-FET has a feature that it can highly bias a gate voltage positively and has a high maximum drain current (Imax). Particularly, a J-FET in which a p-type semiconductor layer is formed only just under the gate electrode by using selective regrowth technology has better in-wafer uniformity of a threshold voltage than a J-FET having a p-n junction gate formed by a thermal diffusion method, and it is known as a promising device structure (e.g. cf. Japanese Unexamined Patent Publications Nos. 2007-27594 and 2000-323495).

Japanese Unexamined Patent Publication No. 2007-27594 discloses an example of a J-FET having a selective regrowth p-n junction gate fabricated on a semi-insulating GaAs substrate (prior art 1). FIG. 23 shows a cross-sectional view of a J-FET 81 according to the prior art 1.

Referring to FIG. 23, the J-FET 81 is composed of a multilayer semiconductor layer in which a buffer layer 2, a Si-doped n-type AlGaAs electron supply layer 3, an undoped AlGaAs spacer layer 4, an undoped InGaAs channel layer 5, an undoped AlGaAs spacer layer 6, a Si-doped n-type AlGaAs electron supply layer 7, an undoped AlGaAs layer 8, an undoped GaAs layer 9, an undoped InGaP stopper layer 10, an undoped GaAs gate burying layer 11, a Si-doped n-type AlGaAs stopper layer 12, and a Si-doped n-type GaAs cap layer 13 are sequentially laminated above a semi-insulating GaAs substrate 1.

A first recess is made in the Si-doped n-type AlGaAs stopper layer 12 and the Si-doped n-type GaAs cap layer 13. In the first recess, an oxide film 30 with a thickness of 400 nm is embedded as a gate insulating film.

Further, a second recess is made in the undoped InGaP stopper layer 10 and the undoped GaAs gate burying layer 11. In the second recess, a C-doped p$^+$-GaAs layer 18 is buried.

On the Si-doped n-type GaAs cap layer 13, a source electrode 14 and a drain electrode 15 are formed. On the C-doped p$^+$-GaAs layer 18 that is buried in the second recess, a gate electrode 19 is formed. In this manner, the gate electrode 19 is located above and in contact with the C-doped p$^+$-GaAs layer 18, thereby forming a p-n junction gate.

According to the prior art 1, the second recess is made by selectively etching away the undoped InGaP stopper layer 10 and the undoped GaAs gate burying layer 11 by using the oxide film 30 having an opening at the gate as a mask. Then, in the second recess, a GaAs layer to which a C impurity is added at high concentrations is selectively regrown, thereby forming the C-doped p$^+$-GaAs layer 18.

Japanese Unexamined Patent Publication No. 2000-323495 discloses an example of a J-FET having a p-n junction gate formed by Zn vapor diffusion (prior art 2). FIG. 24 shows a cross-sectional view of a J-FET 82 according to the prior art 2.

Referring to FIG. 24, the J-FET 82 includes an n-channel region 36 placed in an upper layer of a semi-insulating GaAs substrate 31, an n$^+$ source region 34 and an n$^+$ drain region 35 placed at both ends of the n-channel region 36, a p$^+$ region 37 placed in the center area in an upper layer of the n-channel region 36, a gate electrode 38 placed on the p$^+$ region 37, and a source electrode 39 and a drain electrode 40 in ohmic contact that are placed on the n$^+$ source region 34 and the n$^+$ drain region 35, respectively. Further, a protective film is placed all over the substrate excluding the gate electrode 38, the source electrode 39 and the drain electrode 40. The protective film is formed as a two-layer laminated structure made up of a nitride film 32 with a thickness of 20 nm that is deposited as a first protective film and an oxide film 33 with a thickness of 20 nm that is deposited as a second protective film.

According to the prior art 2, the protective film made up of the nitride film 32 and the oxide film 33 is etched to make an opening above a gate formation area, and Zn ion is implanted into the gate formation area through the opening by using the protective film as a mask. Then, a Zn impurity is diffused by performing heat treatment, thereby forming the p$^+$ region 37.

Japanese Unexamined Patent Publication No. 2007-27594 further discloses an example of a J-FET with a selective regrowth p-n junction gate having a nitride film as a gate insulating film (prior art 3). FIG. 25 shows a cross-sectional view of a J-FET 83 according to the prior art 3. Referring to FIG. 25, a nitride film 43 with a thickness of 400 nm is embedded as a gate insulating film in the first recess.

As a semiconductor integrated circuit becomes more sophisticated in functionality, a semiconductor device in which a J-FET is monolithic with a Schottky gate FET has been widely known. FIG. 26 is a cross-sectional view showing a semiconductor device 91 according to related art in which a J-FET 84 having an oxide film 30 as a gate insulating film like the J-FET 81 according to the prior art 1 is formed on the same substrate as a Schottky gate FET 84b. Referring to FIG. 26, in a first area of the semiconductor device 91, the J-FET 84 having a p-n junction gate that is formed by selectively regrowing the C-doped p$^+$-GaAs layer 18 is formed. In a second area that is electrically isolated from the first area by an isolation area 50, the Schottky gate FET 84b having a Schottky gate electrode 47 is formed.

In the semiconductor device 91 shown in FIG. 26, an undoped AlGaAs layer 45 is placed between the undoped InGaP stopper layer 10 and the undoped GaAs gate burying layer 11. In the Schottky gate FET 84b, the Schottky gate electrode 47 is formed above and in contact with the undoped AlGaAs layer 45. In the J-FET 84, a second recess is made in the undoped InGaP stopper layer 10, the undoped AlGaAs layer 45 and the undoped GaAs gate burying layer 11, and the C-doped p$^+$-GaAs layer 18 is buried in the second recess. In this manner, in the semiconductor device 91, each layer is shared by the J-FET 84 and the Schottky gate FET 84b, and the same oxide film 30 as that of the J-FET 84 is used also as a gate insulating film of the Schottky gate FET 84b.

However, in the prior art 1, there is a concern that if a high voltage is applied between the gate and the drain, a positive shift of the threshold voltage is occurred. This is considered to be caused by the following reason.

In the selective regrowth process, a temperature of 400° C. or higher, or more preferably 450° C. or higher, is necessary in order to regrow the C-doped p$^+$-GaAs layer 18 having good crystallinity. The oxide film 30 has characteristics that it is likely to extract Ga from the undoped GaAs gate burying layer 11 in contact therewith under a high temperature of 400° C. or above (cf. Appl. Phys. Lett. 54, pp. 2559, 1989). Therefore, Ga is extracted through the side surface of the C-doped p+-GaAs layer 18 or the surface of the undoped GaAs gate burying layer 11 next to it, and traps due to the Ga vacancy are formed in large amounts. Negative electric charges are captured into the traps and the surface potential rises, and, consequently, carrier concentrations in the channel decrease. As a result, it is considered that a threshold voltage is shifted when a high voltage is applied between the gate and the drain.

On the other hand, in the prior art 2, because the nitride film 32 with less extraction of Ga is used as the first protective film that is in contact with the GaAs substrate 31, and the temperature necessary for Zn diffusion is lower than the temperature (400° C.) necessary in the regrowth process, extraction of Ga does not substantially occur. However, the nitride film that is deposited by plasma CVD has characteristics that it contains a large amount of residual hydrogen in the film. Although the residual hydrogen is bonded to silicon forming the nitride film, the bonding is cut if a high electric field is applied, and traps due to dangling bond are generated. Therefore, threshold voltage shift caused by the traps occurs.

Further, the Zn thermal diffusion method used in the prior art 2 has a concern that it is difficult to control a diffusion depth and a threshold voltage uniformity is low. Furthermore, a gate electrode overhang 41 onto the protective film causes a gate parasitic capacitor 42 to be formed between the gate overhang 41 and the semiconductor. Because the insulating film under the gate overhang 41 is as thin as 40 nm in the prior art 2 shown in FIG. 24, the capacitance of the gate parasitic capacitor 42 is large. Particularly, because the nitride film 32 has a higher dielectric constant than the oxide film 33, the capacitance of the gate parasitic capacitor 42 further increases. The increase in the capacitance of the gate parasitic capacitor 42 causes a concern that significant degradation of high-frequency characteristics of an element, such as a decrease in power gain, occurs.

Further, in the prior art 3, because the nitride film 43 with a large film stress is formed at a large thickness, a large stress is generated upon temperature decrease after regrowth, which causes crystal defect or the like. There is thus a concern that long-term reliability is low.

As described above, in the prior arts 1 to 3, it is difficult to implement the J-FET having high reliability with less threshold voltage shift before and after a voltage stress.

Further, in the semiconductor device 91 according to the related art, the Schottky gate FET 84b also has the interface between the oxide film and the semiconductor next to the Schottky gate electrode 47. At the interface, a large amount of traps exist at high density as described earlier. Therefore, threshold voltage shift occurs when a voltage stress is applied thereto.

SUMMARY

A first exemplary aspect of an embodiment of the present invention is a field effect transistor that includes a channel layer of a first conductivity type formed above a semiconductor substrate, an upper semiconductor layer made up of at least one semiconductor layer and formed above the channel layer of the first conductivity type, a semiconductor layer of a second conductivity type formed in a recess made in the upper semiconductor layer or formed above the upper semiconductor layer, a gate electrode formed above and in contact with the semiconductor layer of the second conductivity type, and a gate insulating film including a nitride film formed above and in contact with the upper semiconductor layer and an oxide film formed above the nitride film and having a larger thickness than the nitride film. In this structure, extraction of Ga in the regrowth process is reduced, and it is thereby possible to reduce the density of traps at and near the interface between the gate insulating film and the semiconductor. Further, a stress generated at the time of temperature decrease after regrowth is reduced, and it is thereby possible to suppress the occurrence of crystal defect due to a stress.

A second exemplary aspect of an embodiment of the present invention is a method of manufacturing a field effect transistor that includes forming a channel layer of a first conductivity type above a semiconductor substrate, forming an upper semiconductor layer containing Ga above the channel layer of the first conductivity type, forming a gate insulating film by forming a nitride film and an oxide film above the upper semiconductor layer containing Ga, selectively regrowing a semiconductor layer of a second conductivity type by using the gate insulating film as a mask, and forming a gate electrode above the semiconductor layer of the second conductivity type. In this method, extraction of Ga in the regrowth process is reduced, and it is thereby possible to reduce the density of traps at and near the interface between the gate insulating film and the semiconductor. Further, residual hydrogen in the nitride film is reduced by heat treatment in the regrowth process, and it is thereby possible to reduce the density of traps occurring by application of high-voltage bias.

According to the exemplary aspects of an embodiment of the present invention, it is possible to provide a field effect transistor having high reliability with less threshold voltage shift before and after a voltage stress, a method of manufacturing the same and a semiconductor device.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described hereinbelow. The explanation provided hereinbelow merely illustrates exemplary embodiments of the present invention, and the present invention is not limited to the below-described exemplary embodiments. The following description and the accompanying drawings are appropriately shortened and simplified to clarify the explanation. Further, redundant explanation is omitted as appropriate to clarify the explanation. In the figures, the identical reference symbols denote identical elements and the explanation thereof is omitted as appropriate.

First Exemplary Embodiment

Figure 1:
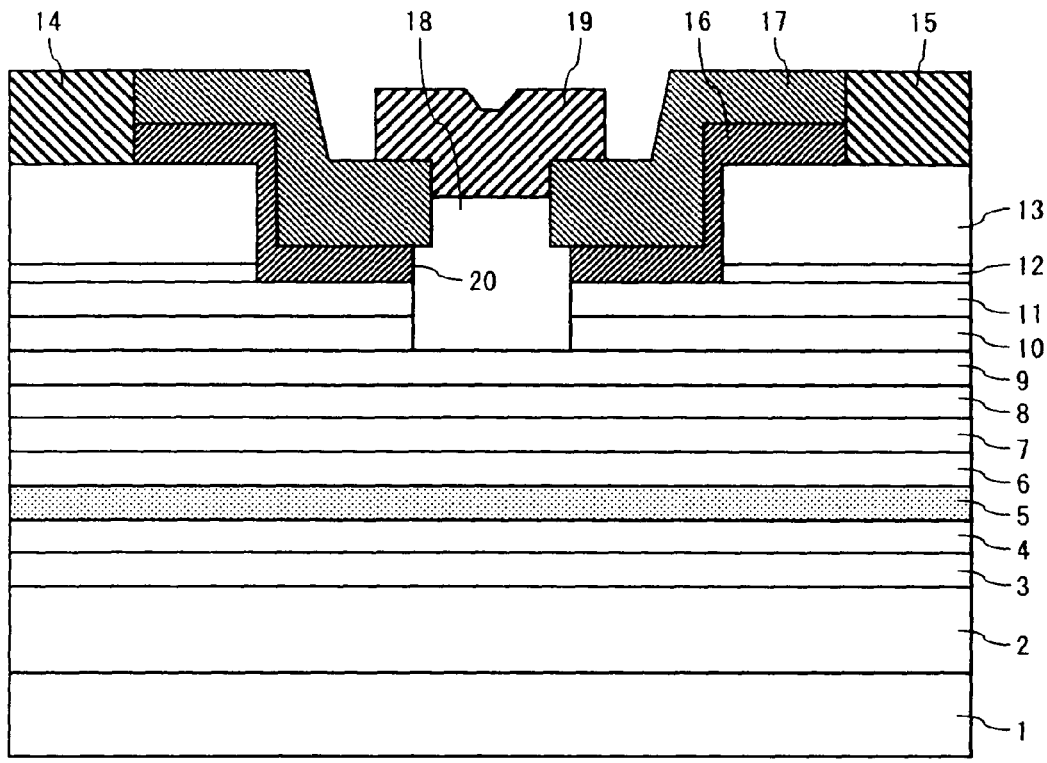
FIG. 1 is a cross-sectional view of a J-FET 51 according to a first exemplary embodiment of the present invention.

The structure of a J-FET 51 according to an exemplary embodiment of the present invention is described firstly with reference to FIG. 1. FIG. 1 is a cross-sectional view of the J-FET 51 according to the first exemplary embodiment. Referring to FIG. 1, in the J-FET 51, a buffer layer 2 (with a thickness of 400 nm, for example), a Si-doped n-type AlGaAs electron supply layer 3 (with a thickness of 4 nm, for example), an undoped AlGaAs spacer layer 4 (with a thickness of 2 nm, for example), an undoped InGaAs channel layer 5 (with a thickness of 15 nm, for example), an undoped AlGaAs spacer layer 6 (with a thickness of 2 nm, for example), a Si-doped n-type AlGaAs electron supply layer 7 (with a thickness of 10 nm, for example), an undoped AlGaAs layer 8 (with a thickness of 5 nm, for example), an undoped GaAs layer 9 (with a thickness of 5 nm, for example), an undoped InGaP stopper layer 10 (with a thickness of 5 nm, for example), an undoped GaAs gate burying layer 11 (with a thickness of 15 nm, for example), a Si-doped n-type AlGaAs stopper layer 12 (with a thickness of 10 nm, for example), and a Si-doped n-type GaAs cap layer 13 (with a thickness of 100 nm, for example) are sequentially laminated above a semi-insulating GaAs substrate 1.

The buffer layer 2 is a layer placed to reduce the effect of impurities accumulated at the interface between the semi-insulating GaAs substrate 1 and the semiconductor layer laminated on the semi-insulating GaAs substrate 1. For example, the buffer layer 2 is formed using undoped AlGaAs.

The Si-doped n-type AlGaAs electron supply layer 3 and the Si-doped n-type AlGaAs electron supply layer 7 are layers placed to supply a high electron density to the undoped InGaAs channel layer 5. Thus, a Si impurity with $2 \times 10^{18}$ cm$^{-3}$, for example, is added to the Si-doped n-type AlGaAs electron supply layer 3 and the Si-doped n-type AlGaAs electron supply layer 7. Because the undoped InGaAs channel layer 5 is placed between the Si-doped n-type AlGaAs electron supply layer 3 and the Si-doped n-type AlGaAs electron supply layer 7, a high electron density can be supplied to the undoped InGaAs channel layer 5. Thus, the Si-doped n-type AlGaAs electron supply layer 3, the undoped AlGaAs spacer layer 4, the undoped InGaAs channel layer 5, the undoped AlGaAs spacer layer 6 and the Si-doped n-type AlGaAs electron supply layer 7 serve as a channel layer of the J-FET 51.

In the J-FET, a current flowing through the undoped InGaAs channel layer 5 is controlled by a gate voltage. The control is made according to the width of a depletion layer in the undoped InGaAs channel layer 5. As the undoped InGaAs channel layer 5, an undoped GaAs layer may be used instead of an undoped InGaAs layer.

The undoped AlGaAs layer 8, the undoped GaAs layer 9, the undoped InGaP stopper layer 10 and the undoped GaAs gate burying layer 11 are referred to hereinafter as an upper semiconductor layer that is formed on top of the channel layer of the J-FET 51.

A first recess is made in the Si-doped n-type AlGaAs stopper layer 12 and the Si-doped n-type GaAs cap layer 13. A Si impurity with $4 \times 10^{18}$ cm$^{-3}$, for example, is added to the Si-doped n-type AlGaAs stopper layer 12 and the Si-doped n-type GaAs cap layer 13.

In this exemplary embodiment, a nitride film 16 (with a thickness of 50 nm, for example), and an oxide film 17 (with a thickness of 350 nm, for example) are embedded as a gate insulating film in the first recess. The nitride film 16 is continuously formed from the bottom surface of the first recess to the upper surface of the Si-doped n-type GaAs cap layer 13. Thus, the nitride film 16 is in contact with the undoped GaAs gate burying layer 11 that is located at the uppermost of semiconductor layers constituting the upper semiconductor layer on the bottom surface of the first recess and in contact with the Si-doped n-type AlGaAs stopper layer 12 and the Si-doped n-type GaAs cap layer 13 on the side surface of the first recess. Further, the nitride film 16 is placed on top of the Si-doped n-type GaAs cap layer 13 outside the first recess. The oxide film 17 is formed on the nitride film 16. It is preferred that the total thickness of the nitride film 16 and the oxide film 17 is 200 nm or larger. It is also preferred that the nitride film 16 is thinner than the oxide film 17 and it has a thickness of 100 nm or smaller. It is thereby possible to suppress an increase in parasitic capacitance under the gate electrode overhang, which is described later, and obtain large high-frequency power gain. Further, with use of the nitride film 16 with a thickness of 100 nm or smaller, it is possible to prevent the occurrence of crystal defect due to a stress and obtain high long-term reliability.

Further, a second recess is made in the upper semiconductor layer. Specifically, the second recess is made in the undoped InGaP stopper layer 10 and the undoped GaAs gate burying layer 11, which are a part of the semiconductor layers constituting the upper semiconductor layer. In the second recess, a C-doped p$^+$-GaAs layer 18 (with a thickness of 80 nm, for example) is buried. The C-doped p$^+$-GaAs layer 18 is in contact with the undoped InGaP stopper layer 10 and the undoped GaAs gate burying layer 11 on the side surface of the second recess. Further, the C-doped p$^+$-GaAs layer 18 is in contact with the undoped GaAs layer 9 on the bottom surface of the second recess. A C impurity with $1 \times 10^{20}$ cm$^{-3}$, for example, is added to the C-doped p$^+$-GaAs layer 18. The p-type impurity concentration of the C-doped p$^+$-GaAs layer 18 is preferably higher than the n-type impurity concentration of the Si-doped n-type AlGaAs electron supply layer 7, and it is preferably $4 \times 10^9$ cm$^{-3}$ or higher. The concentration lower than $4 \times 10^{19}$ cm$^{-3}$ is not preferred because the width of the depletion layer extended inside the C-doped p$^+$-GaAs layer 18 becomes larger than the width of the depletion layer extended to the Si-doped n-type AlGaAs electron supply layer 7.

A gate electrode 19 is formed on the C-doped p$^+$-GaAs layer 18 that is buried in the second recess. The gate electrode 19 is in contact with the oxide film 17. The gate electrode 19 is made of WSi, for example. In this manner, the gate electrode 19 serving as an ohmic electrode is brought into contact with the C-doped p$^+$-GaAs layer 18, so that a p-n junction gate is formed.

Further, a source electrode 14 and a drain electrode 15 are formed on the Si-doped n-type GaAs cap layer 13. The source electrode 14 and the drain electrode 15 are formed using an AuGe—Ni—Au alloy layer, for example. The source electrode 14 and the drain electrode 15 are in contact with the nitride film 16 and the oxide film 17.

In the J-FET 51 having such a structure, the first recess is made by etching away the Si-doped n-type GaAs cap layer 13 and the Si-doped n-type AlGaAs stopper layer 12. After that, in this exemplary embodiment, the nitride film 16 and the oxide film 17 are sequentially deposited thereon. Then, photoresist is patterned on the gate formation area on the oxide film 17. Using the photoresist pattern, the oxide film 17 and the nitride film 16 are etched away to make an opening at the gate. Because a dry etching rate of the nitride film 16 is higher than that of the oxide film 17, a side-etch 20 is formed as shown in FIG. 1.

Next, the second recess is made by etching away the undoped GaAs gate burying layer 11 and the undoped InGaP stopper layer 10 by using the nitride film 16 and the oxide film 17 having the opening at the gate as a mask. After that, the C-doped p$^+$-GaAs layer 18 is selectively regrown (epitaxial growth) in the second recess by using the same nitride film 16 and the oxide film 17 having the opening at the gate as a mask. A regrowth temperature is 450° C., for example. After the selective regrowth, the gate electrode 19 to serve as an ohmic electrode for the C-doped p$^+$-GaAs layer 18 is formed. In the above process, the J-FET 51 having a p-n junction gate is completed.

Figure 2:
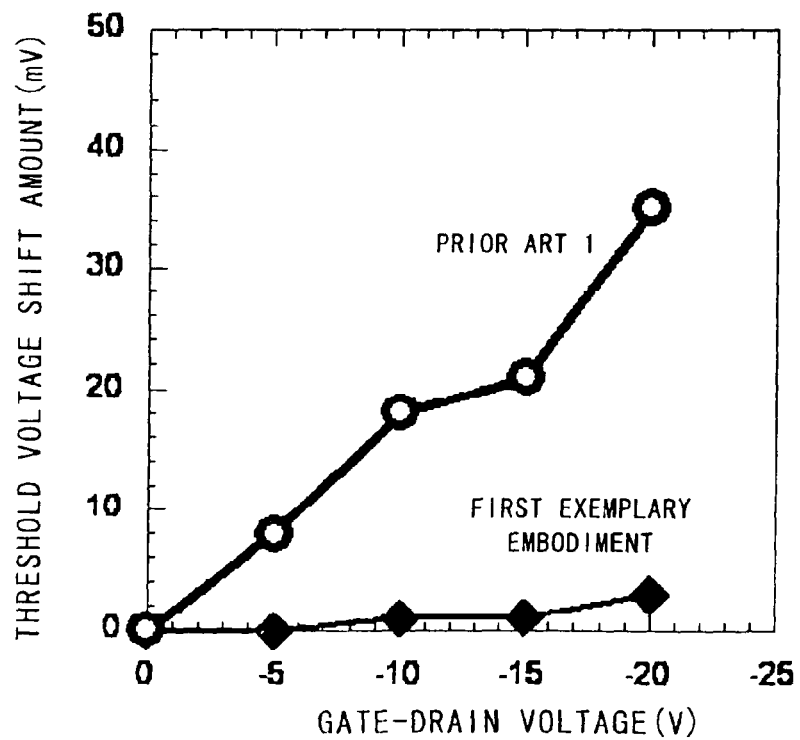
FIG. 2 is a graph showing reverse gate-drain voltage dependence of threshold voltage shift before and after bias application.

In the J-FET 51 fabricated in the above process, even if a high voltage is applied between the gate and the drain, threshold voltage shift before and after the voltage application is small. This is described hereinafter with reference to FIG. 2. FIG. 2 is a graph showing reverse gate-drain voltage dependence of threshold voltage shift before and after bias application. As shown in FIG. 2, the threshold voltage shift amount when applying a gate-drain voltage of −20V is as small as 3 mV in the J-FET 51 according to the exemplary embodiment, while it is 35 mV in the J-FET 81 according to the prior art 1. This is because the nitride film 16 with less extraction of Ga during the regrowth process is formed above and in contact with the undoped GaAs gate burying layer 11 placed next to the p-n junction gate, and the residual hydrogen in the nitride film 16 is reduced by heat treatment in the regrowth process. Since the density of traps is low on and near the surface of the undoped GaAs gate burying layer 11 and in the nitride film 16, the amount of captured negative electric charges under a high voltage is reduced, so that threshold voltage shift is suppressed.

Further, because the J-FET 51 has the p-n junction gate with a high gate barrier, it is possible to apply a high gate voltage and obtain Imax of as high as 430 mA/mm. Furthermore, because the p-n junction is formed by selectively regrowing the C-doped p$^+$-GaAs layer 18 in the second recess that is made by selective etching, it is possible to reduce the standard deviation of threshold voltage across a wafer to 15 mV or smaller.

As described in the foregoing, according to the exemplary embodiment, the gate insulating film has a two-layer structure in which the nitride film 16 and the oxide film 17 are sequentially laminated on top of the undoped GaAs gate burying layer 11, and the p-n junction gate is formed by selective regrowth. This reduces extraction of Ga in the regrowth process, so that the density of traps at and near the interface between the gate insulating film and the semiconductor decreases. Further, the residual hydrogen in the nitride film 16 is reduced by heat treatment in the regrowth process, so that the density of traps occurring by application of high-voltage bias decreases. It is thereby possible to suppress threshold voltage shift.

Further, according to the exemplary embodiment, the gate insulating film under the gate overhang is formed as thick as 200 nm or larger, and the nitride film 16 having a high dielectric constant is formed as thin as 100 nm or smaller. It is thereby possible to suppress an increase in parasitic capacitance under the gate overhang and obtain high-frequency power gain that is substantially equal to the prior art 1. Furthermore, because the nitride film with a thickness of 100 nm or smaller is used, crystal defect due to a stress does not substantially occur, thereby obtaining high long-term reliability.

Although the nitride film 16 is continuously formed from the bottom surface of the first recess to the upper surface of the Si-doped n-type GaAs cap layer 13 in the above description, the area where the nitride film 16 is disposed is not limited thereto.

Figure 3:
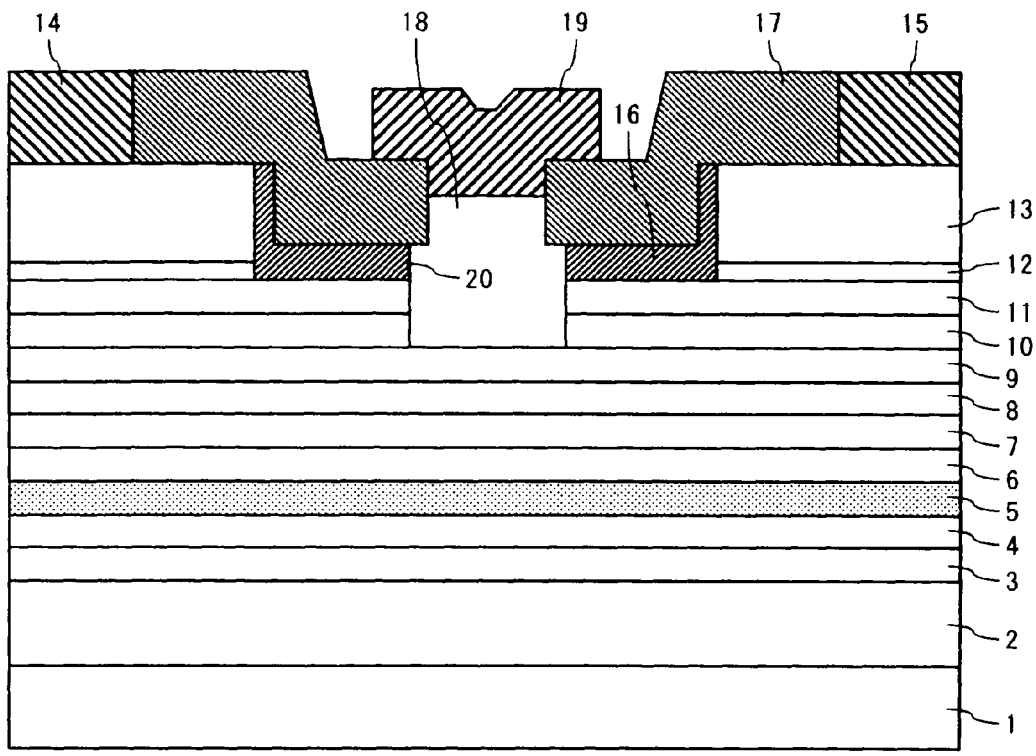
FIG. 3 is a cross-sectional view of a J-FET 52 according to another example of the first exemplary embodiment of the present invention.

FIG. 3 is a cross-sectional view of a J-FET 52 according to another example of the first exemplary embodiment of the present invention. As shown in FIG. 3, the nitride film 16 may be continuously formed from the bottom surface of the first recess to the side surface of the first recess. The nitride film 16 of the J-FET 52 is thereby in contact with the undoped GaAs gate burying layer 11 on the bottom surface of the first recess and in contact with the Si-doped n-type AlGaAs stopper layer 12 and the Si-doped n-type GaAs cap layer 13 on the side surface of the first recess. Thus, in the J-FET 52, the nitride film 16 is not placed on top of the Si-doped n-type GaAs cap layer 13 outside the first recess. Then, the oxide film 17 is continuously formed from the top of the nitride film 16 to the upper surface of the Si-doped n-type GaAs cap layer 13. Thus, in the J-FET 52, the nitride film 16 is not in contact with the source electrode 14 and the drain electrode 15.

Figure 4:
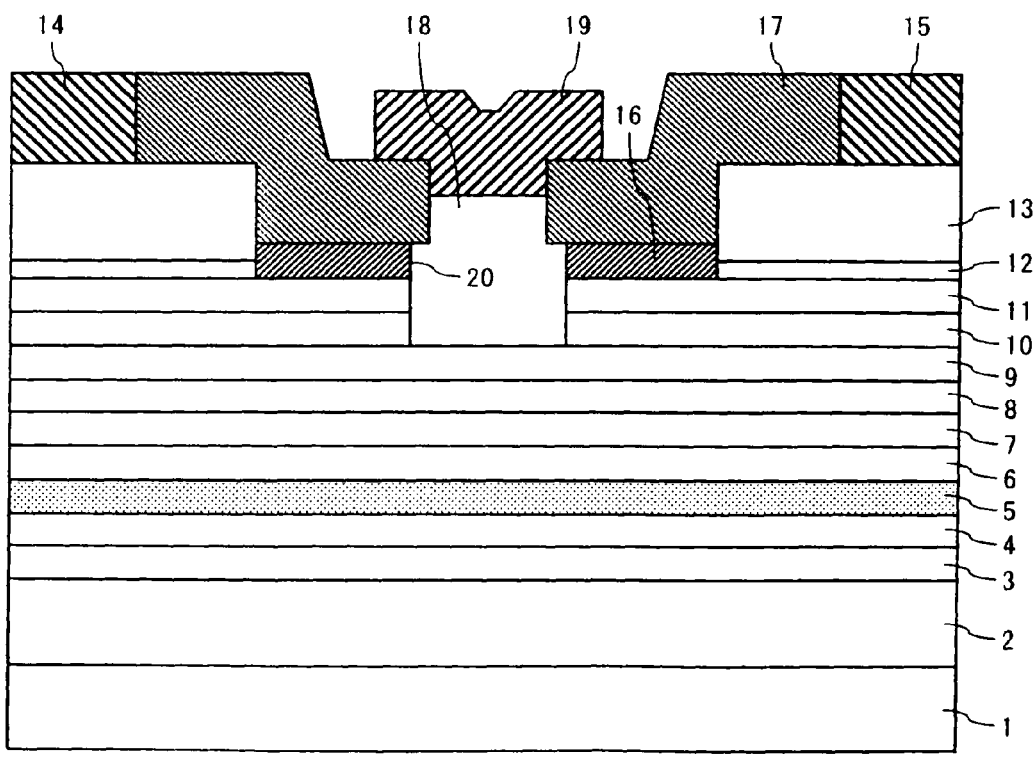
FIG. 4 is a cross-sectional view of a J-FET 53 according to yet another example of the first exemplary embodiment of the present invention.

FIG. 4 is a cross-sectional view of a J-FET 53 according to yet another example of the first exemplary embodiment of the present invention. As shown in FIG. 4, the nitride film may be formed only on the bottom surface of the first recess. Thus, the nitride film 16 of the J-FET 53 is in contact with the undoped GaAs gate burying layer 11 on the bottom surface of the first recess. Therefore, in the J-FET 53, the nitride film 16 is not placed on the side surface of the first recess and on top of the Si-doped n-type GaAs cap layer 13 outside the first recess. Then, the oxide film 17 is continuously formed from the top of the nitride film 16 to the upper surface of the Si-doped n-type GaAs cap layer 13 through the side surface of the first recess. Thus, in the J-FET 53, the nitride film 16 is not in contact with the source electrode 14 and the drain electrode 15.

In this manner, the same advantages as those of the J-FET 51 can be obtained if the nitride film 16 is formed at least on the bottom surface of the first recess.

Second Exemplary Embodiment

Figure 5:
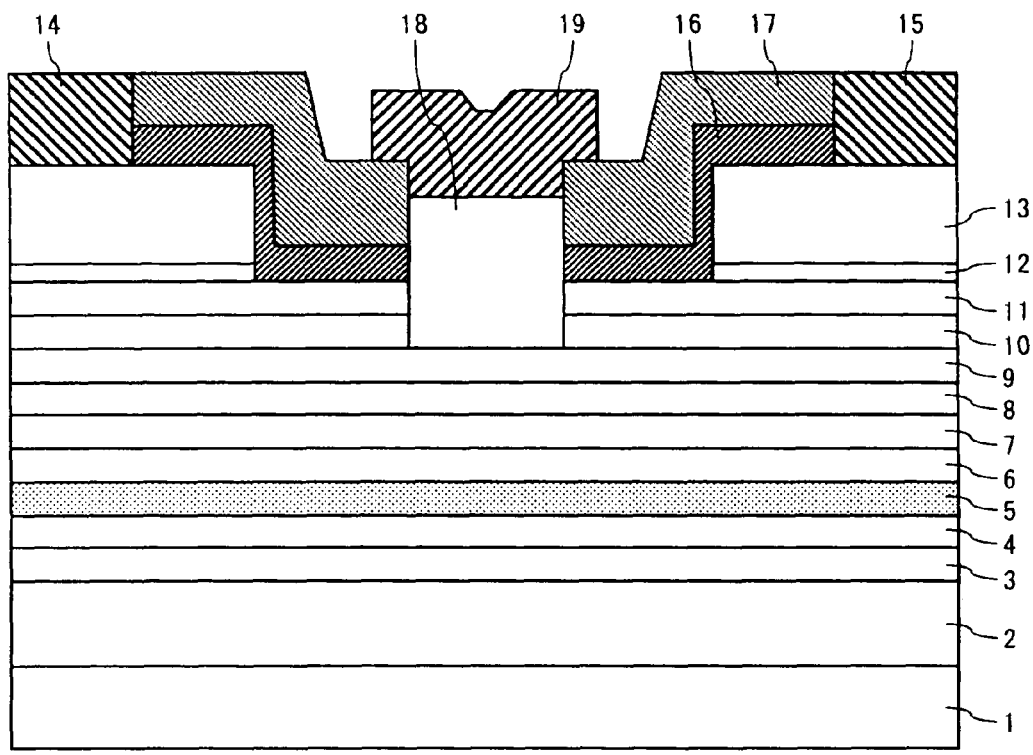
FIG. 5 is a cross-sectional view of a J-FET 54 according to a second exemplary embodiment of the present invention.

The structure of a J-FET 54 according to an exemplary embodiment of the present invention is described hereinafter with reference to FIG. 5. FIG. 5 is a cross-sectional view of the J-FET 54 according to a second exemplary embodiment of the present invention. Although the side-etch 20 is formed in the nitride film 16 as shown in FIG. 1 according to the first exemplary embodiment, the side-etch 20 is not formed as shown in FIG. 5 according to this exemplary embodiment. The other structure is the same as that of the first exemplary embodiment and not repeatedly described.

Referring to FIG. 5, in this exemplary embodiment, the nitride film 16 is not side-etched deeper than the oxide film 17, and the pattern end of the nitride film 16 facing the gate electrode 19 and the pattern end of the oxide film 17 facing the gate electrode 19 are located in the same positions. The J-FET 54 having such a structure is formed by applying dry etching conditions with enhanced anisotropy when etching away the oxide film 17 and the nitride film 16. The same advantages as in the first exemplary embodiment can be obtained even if the side-etch 20 is not formed in the nitride film 16 according to this exemplary embodiment.

Third Exemplary Embodiment

Figure 6:
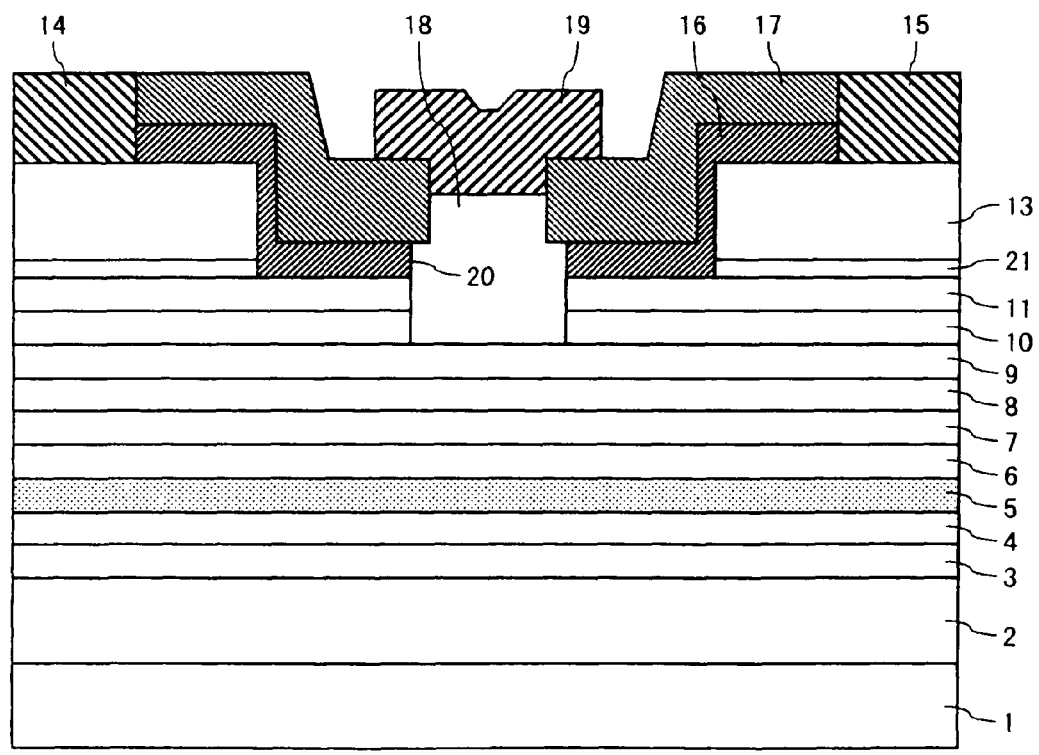
FIG. 6 is a cross-sectional view of a J-FET 55 according to a third exemplary embodiment of the present invention.

The structure of a J-FET 55 according to an exemplary embodiment of the present invention is described hereinafter with reference to FIG. 6. FIG. 6 is a cross-sectional view of the J-FET 55 according to a third exemplary embodiment of the present invention.

As shown in FIG. 6, in this exemplary embodiment, a Si-doped n-type InGaP stopper layer 21 to which a Si impurity is added at high concentrations is formed instead of the Si-doped n-type AlGaAs stopper layer 12 of the J-FET 51 according to the first exemplary embodiment. The other structure is the same as that of the first exemplary embodiment and thus not repeatedly descried. Because the InGaP layer has a lower potential barrier for electrons than the AlGaAs layer, contact resistance from the C-doped p+-GaAs layer 18 to the undoped InGaAs channel layer 5 is reduced. Thus, lower on-resistance can be obtained in the J-FET 55 using InGaP compared to the case of using AlGaAs. In such a case also, the same advantages as in the first exemplary embodiment can be obtained.

Fourth Exemplary Embodiment

Figure 7:
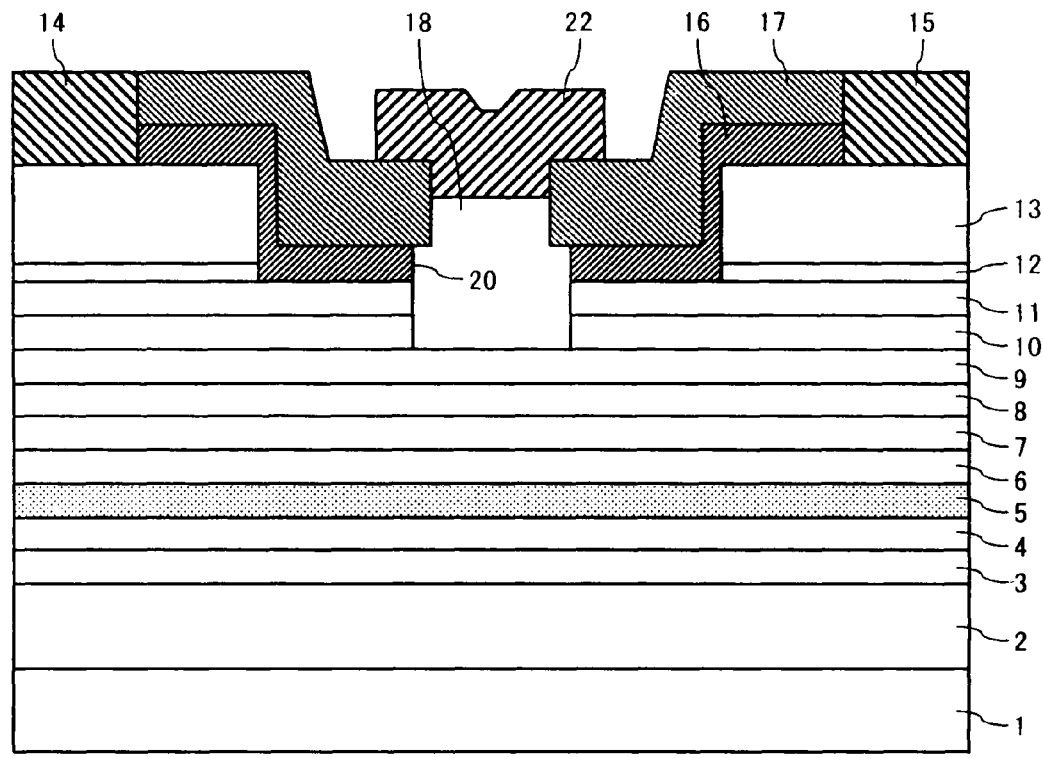
FIG. 7 is a cross-sectional view of a J-FET 56 according to a fourth exemplary embodiment of the present invention.

The structure of a J-FET 56 according to an exemplary embodiment of the present invention is described hereinafter with reference to FIG. 7. FIG. 7 is a cross-sectional view of the J-FET 56 according to a fourth exemplary embodiment of the present invention.

Although WSi is used for the gate electrode 19 in the first exemplary embodiment, the material of the gate electrode 19 is not limited thereto. For example, as shown in FIG. 7, the J-FET 56 that uses TiN—Pt—Au for a gate electrode 22 is also possible. The other structure is the same as that of the first exemplary embodiment and thus not repeatedly descried. Further, another electrode material such as Ti, Al or Pt may be used for the gate electrode 22. In such a case also, the same advantages as in the first exemplary embodiment can be obtained.

Fifth Exemplary Embodiment

Figure 8:
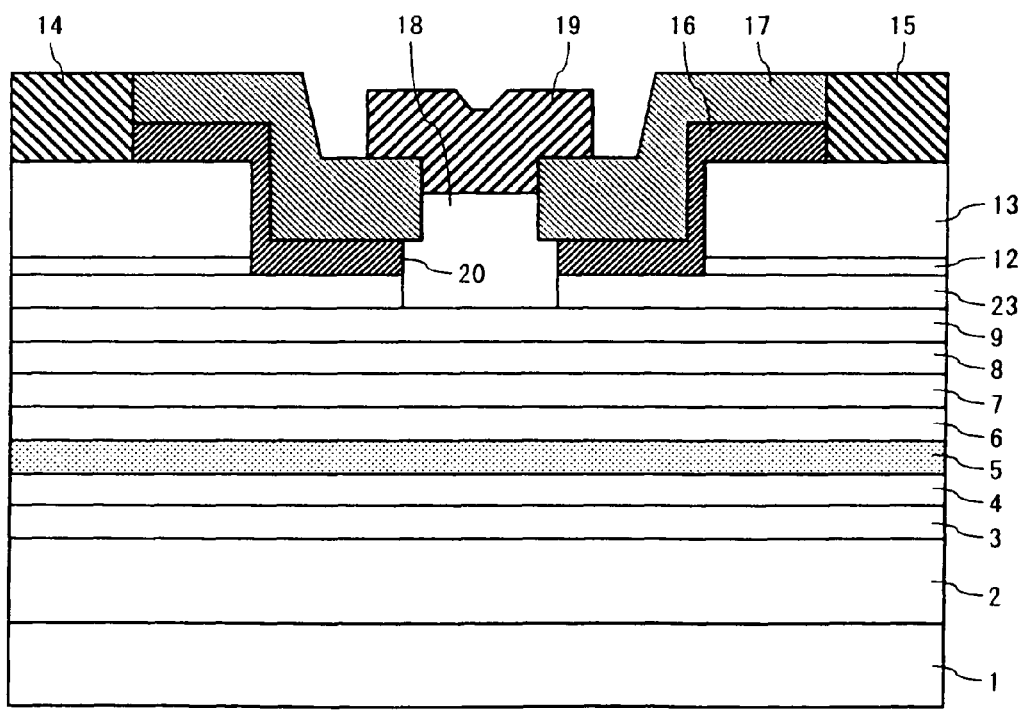
FIG. 8 is a cross-sectional view of a J-FET 57 according to a fifth exemplary embodiment of the present invention.

The structure of a J-FET 57 according to an exemplary embodiment of the present invention is described hereinafter with reference to FIG. 8. FIG. 8 is a cross-sectional view of the J-FET 57 according to a fifth exemplary embodiment of the present invention. In this exemplary embodiment, the structure of the semiconductor layer constituting the upper semiconductor layer in which the second recess is made is different from that of the first exemplary embodiment. The other structure is the same as that of the first exemplary embodiment and thus not described.

As shown in FIG. 8, an undoped InGaP layer 23 (with a thickness of 20 nm, for example), is formed instead of the undoped InGaP stopper layer 10 and the undoped GaAs gate burying layer 11 of the J-FET 51 according to the first exemplary embodiment. Thus, the undoped AlGaAs layer 8, the undoped GaAs layer 9 and the undoped InGaP layer 23 constitute the upper semiconductor layer. The second recess is made in the undoped InGaP layer 23. The C-doped p+-GaAs layer 18 is in contact with the undoped InGaP layer 23 on the side surface of the second recess. In this manner, the second recess is not limited to the one described in the first exemplary embodiment, which is made by etching away the the undoped GaAs gate burying layer 11 and the undoped InGaP stopper layer 10. In this exemplary embodiment also, the same advantages as in the first exemplary embodiment can be obtained.

Sixth Exemplary Embodiment

Figure 9:
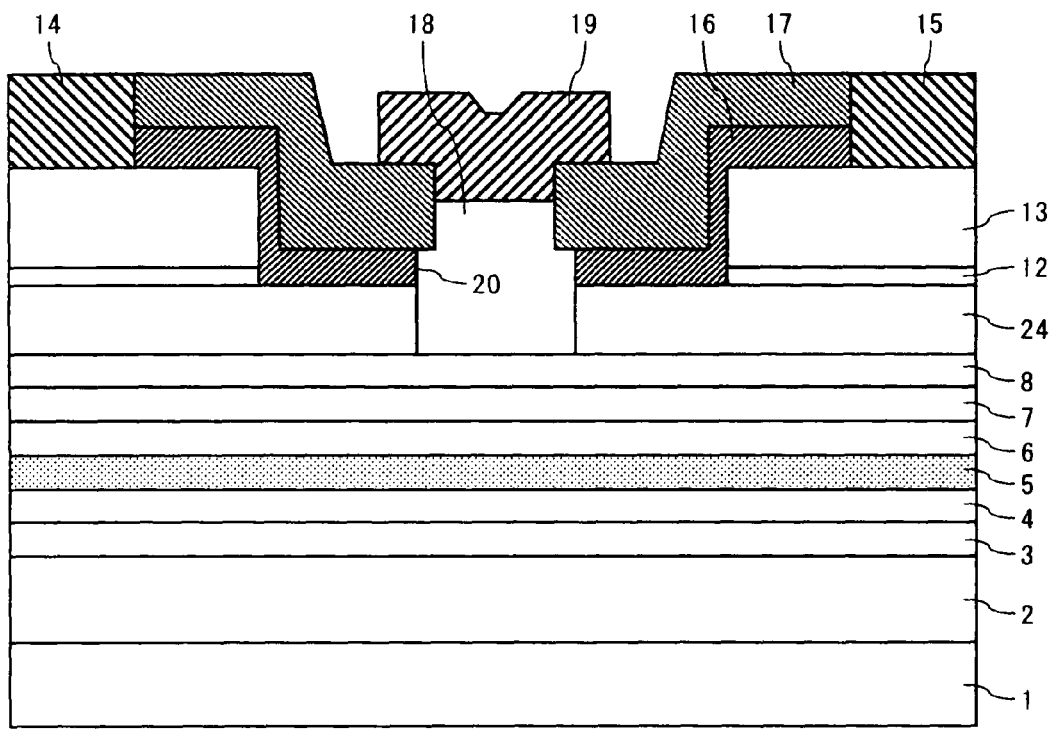
FIG. 9 is a cross-sectional view of a J-FET 58 according to a sixth exemplary embodiment of the present invention.

The structure of a J-FET 58 according to an exemplary embodiment of the present invention is described hereinafter with reference to FIG. 9. FIG. 9 is a cross-sectional view of the J-FET 58 according to a sixth exemplary embodiment of the present invention. In this exemplary embodiment, the structure of the upper semiconductor layer is different from that of the first exemplary embodiment. The other structure is the same as that of the first exemplary embodiment and thus not descried.

As shown in FIG. 9, in this exemplary embodiment, an undoped GaAs layer 24 (with a thickness of 20 nm, for example) is formed instead of the undoped GaAs layer 9, the undoped InGaP stopper layer 10 and the undoped GaAs gate burying layer 11 of the J-FET 51 according to the first exemplary embodiment. Thus, the undoped AlGaAs layer 8 and the undoped GaAs layer 24 constitute the upper semiconductor layer. The second recess is made in the undoped GaAs layer 24. The C-doped p+-GaAs layer 18 is thereby in contact with the undoped GaAs layer 24 on the side surface of the second recess and in contact with the undoped AlGaAs layer 8 on the bottom surface of the second recess. In such a case also, the same advantages as in the first exemplary embodiment can be obtained.

Seventh Exemplary Embodiment

Figure 10:
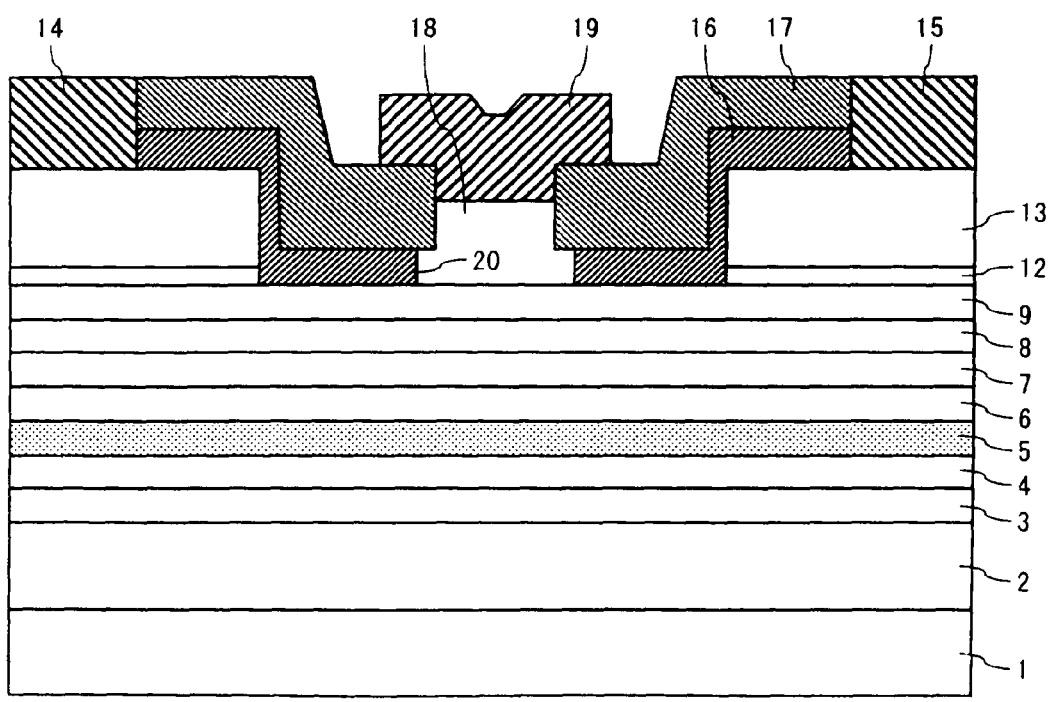
FIG. 10 is a cross-sectional view of a J-FET 59 according to a seventh exemplary embodiment of the present invention.

The structure of a J-FET 59 according to an exemplary embodiment of the present invention is described hereinafter with reference to FIG. 10. FIG. 10 is a cross-sectional view of the J-FET 59 according to a seventh exemplary embodiment of the present invention. In this exemplary embodiment, the structure of the upper semiconductor layer is different from that of the first exemplary embodiment. The other structure is the same as that of the first exemplary embodiment and thus not descried.

Although the second recess is made in the upper semiconductor layer in the first exemplary embodiment, the J-FET 59 that does not have the second recess is also possible as shown in FIG. 10. In this case, the undoped InGaP stopper layer 10 and the undoped GaAs gate burying layer 11 may be eliminated. Thus, the undoped AlGaAs layer 8 and the undoped GaAs layer 9 constitute the upper semiconductor layer. In the J-FET 59, the C-doped p$^+$-GaAs layer 18 is formed in the opening that is made in the gate formation area of the gate insulating film, which is made up of the nitride film 16 and the oxide film 17. Thus, the C-doped p$^+$-GaAs layer 18 is placed above the upper semiconductor layer and in contact with the undoped GaAs layer 9. In such a case also, the same advantages as in the first exemplary embodiment can be obtained.

Eighth Exemplary Embodiment

Figure 11:
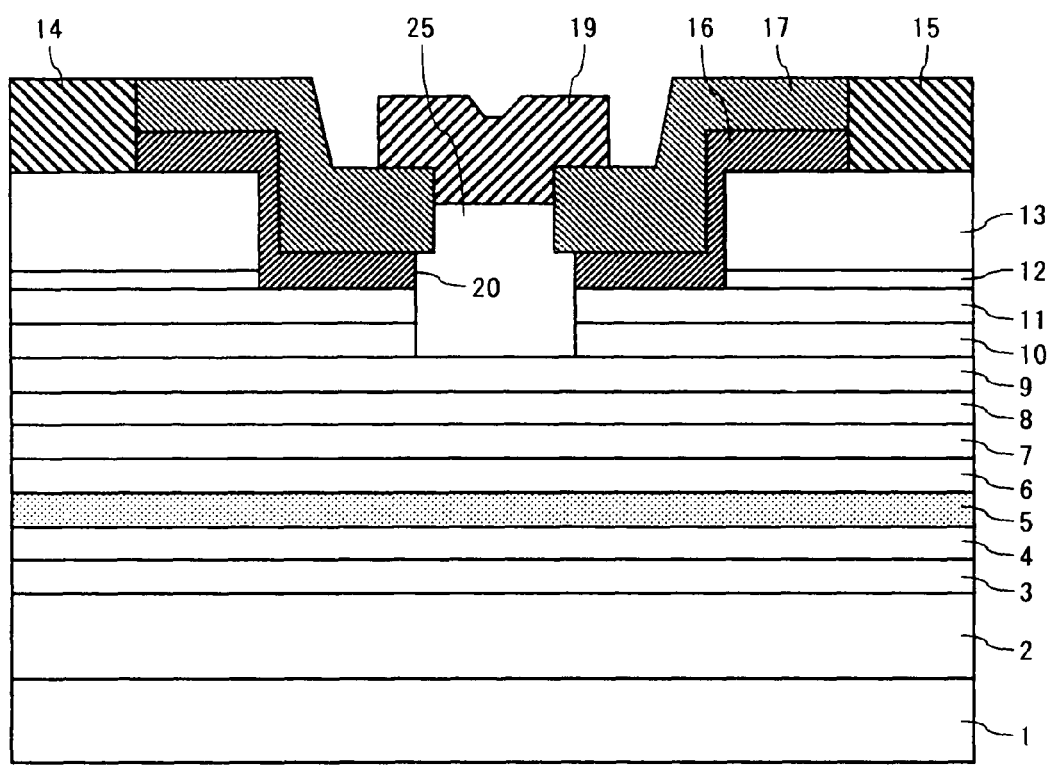
FIG. 11 is a cross-sectional view of a J-FET 60 according to an eighth exemplary embodiment of the present invention.

The structure of a J-FET 60 according to an exemplary embodiment of the present invention is described hereinafter with reference to FIG. 11. FIG. 11 is a cross-sectional view of the J-FET 60 according to an eighth exemplary embodiment of the present invention.

Although the case where the p$^+$ layer forming the p-n junction gate is the C-doped p$^+$-GaAs layer 18 is described by way of illustration in the first exemplary embodiment, the present invention is not limited thereto. For example, the J-FET 60 in which a C-doped p$^+$-AlGaAs layer 25 is formed by selective regrowth instead of the C-doped p$^+$-GaAs layer 18 is also possible as shown in FIG. 11. The other structure is the same as that of the first exemplary embodiment and thus not repeatedly descried. In this manner, the present invention is not limited to the case of applying the C-doped p$^+$-GaAs layer 18 to an enhancement-mode FET p-n junction gate, and the same advantages as in the first exemplary embodiment can be obtained with use of the semiconductor layer to which another kind of p-type impurity is added.

Ninth Exemplary Embodiment

Figure 12:
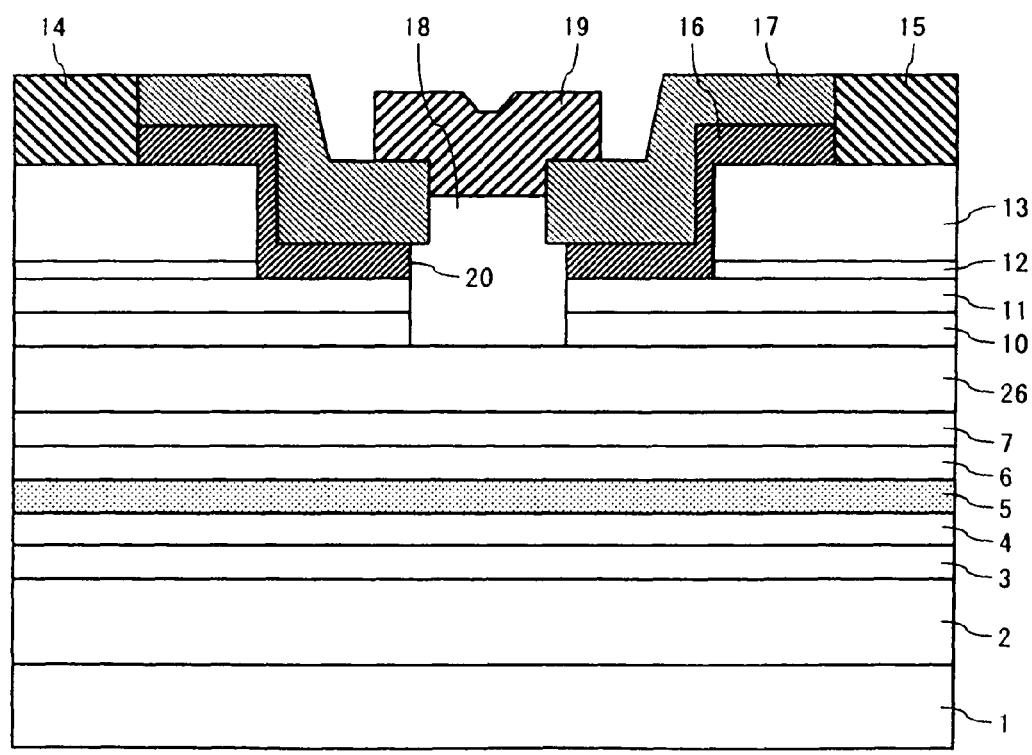
FIG. 12 is a cross-sectional view of a J-FET 61 according to a ninth exemplary embodiment of the present invention.

The structure of a J-FET 61 according to an exemplary embodiment of the present invention is described hereinafter with reference to FIG. 12. FIG. 12 is a cross-sectional view of the J-FET 61 according to a ninth exemplary embodiment of the present invention. In this exemplary embodiment, the structure of the upper semiconductor layer is different from that of the first exemplary embodiment. The other structure is the same as that of the first exemplary embodiment and thus not described.

As shown in FIG. 12, in this exemplary embodiment, an undoped AlGaAs layer 26 (with a thickness of 10 nm, for example) is formed instead of the undoped AlGaAs layer 8 and the undoped GaAs layer 9 of the J-FET 51 according to the first exemplary embodiment. Thus, the undoped AlGaAs layer 26, the undoped InGaP stopper layer 10 and the undoped GaAs gate burying layer 11 constitute the upper semiconductor layer. In the J-FET 61, the selective regrowth p-n junction gate is formed above the undoped AlGaAs layer 26. Therefore, the C-doped p$^+$-GaAs layer 18 is in contact with the undoped AlGaAs layer 26 on the bottom surface of the second recess. In such a case also, the same advantages as in the first exemplary embodiment can be obtained.

Tenth Exemplary Embodiment

Figure 13:
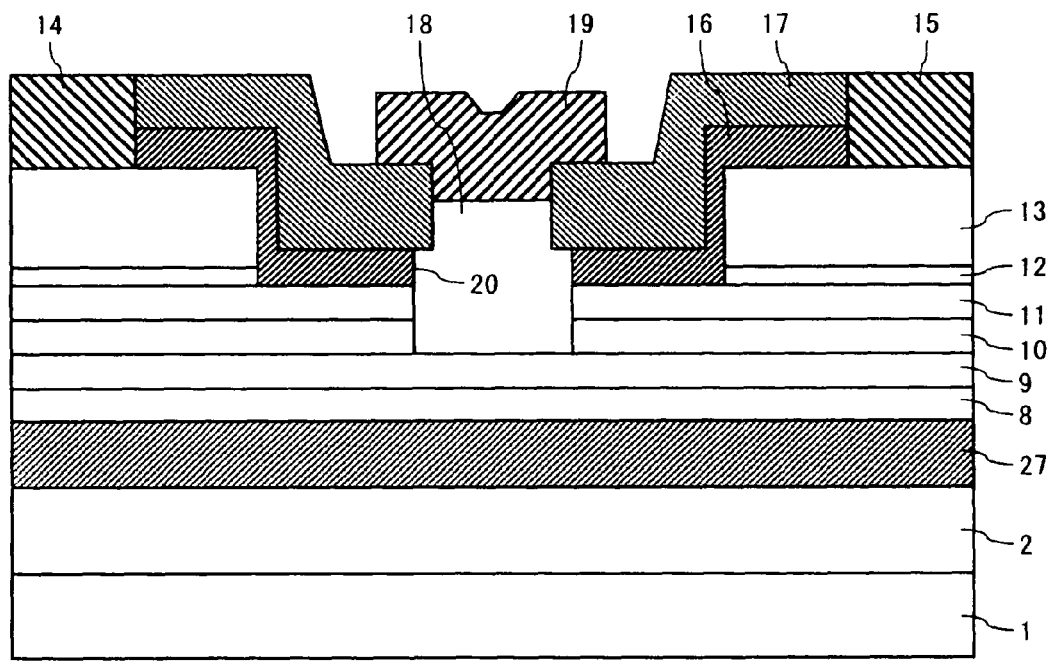
FIG. 13 is a cross-sectional view of a J-FET 62 according to a tenth exemplary embodiment of the present invention.

The structure of a J-FET 62 according to an exemplary embodiment of the present invention is described hereinafter with reference to FIG. 13. FIG. 13 is a cross-sectional view of the J-FET 62 according to a tenth exemplary embodiment of the present invention. In this exemplary embodiment, the structure of the channel layer is different from that of the first exemplary embodiment. The other structure is the same as that of the first exemplary embodiment and thus not described.

Although the undoped InGaAs channel layer 5 is formed in the first exemplary embodiment, the present invention is not limited thereto. For example, the J-FET 62 having a Si-doped n-type GaAs channel layer 27 to which Si is added at high concentrations is also possible as shown in FIG. 13. In this case, in the J-FET 62, the Si-doped n-type AlGaAs electron supply layers 3 and 7 and the undoped AlGaAs spacer layers 4 and 6 are not formed. In such a case also, the same advantages as in the first exemplary embodiment can be obtained.

Eleventh Exemplary Embodiment

Figure 14:
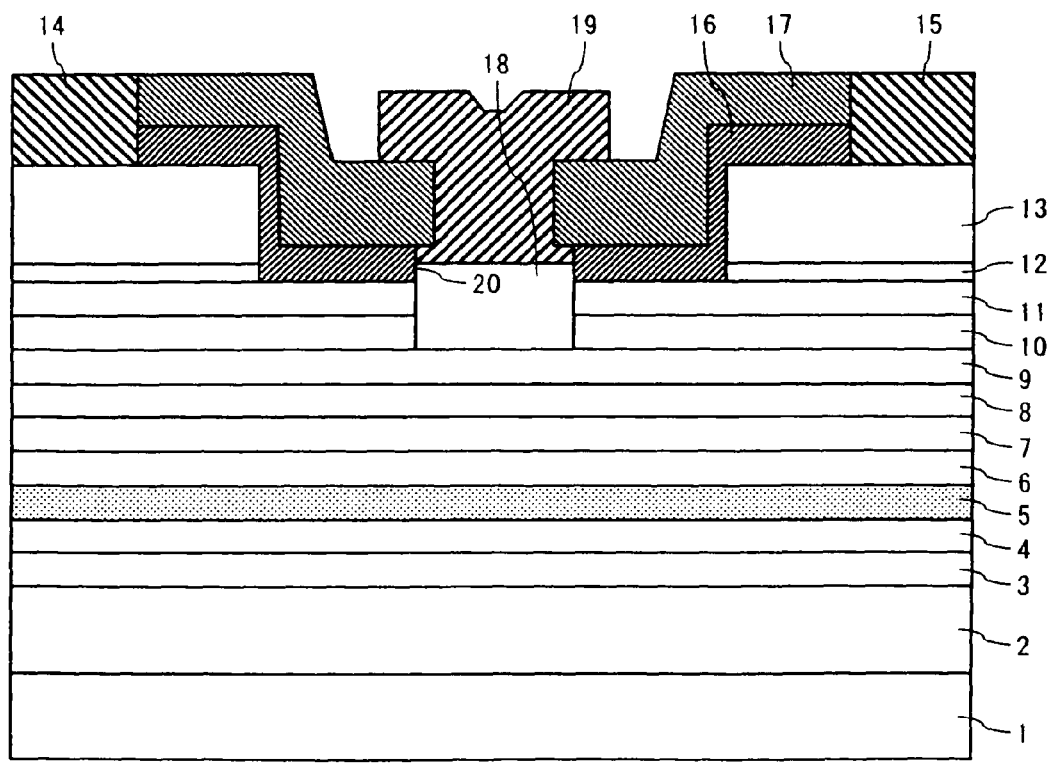
FIG. 14 is a cross-sectional view of a J-FET 63 according to an eleventh exemplary embodiment of the present invention.

The structure of a J-FET 63 according to an exemplary embodiment of the present invention is described hereinafter with reference to FIG. 14. FIG. 14 is a cross-sectional view of the J-FET 63 according to an eleventh exemplary embodiment of the present invention.

Although the case where the C-doped p$^+$-GaAs layer 18 with a thickness of 80 nm is formed and selectively regrown to the position higher than the boundary between the nitride film 16 and the oxide film 17 is described by way of illustration in the first exemplary embodiment, the present invention is not limited thereto. For example, the J-FET 63 in which the C-doped p$^+$-GaAs layer 18 with a thickness of 40 nm is selectively regrown is also possible as shown in FIG. 14. The other structure is the same as that of the first exemplary embodiment and thus not described. In this manner, the C-doped p$^+$-GaAs layer 18 may have a thickness equal to or larger than the depth of the second recess. In this exemplary embodiment also, the same advantages as in the first exemplary embodiment can be obtained.

Twelfth Exemplary Embodiment

Figure 15:
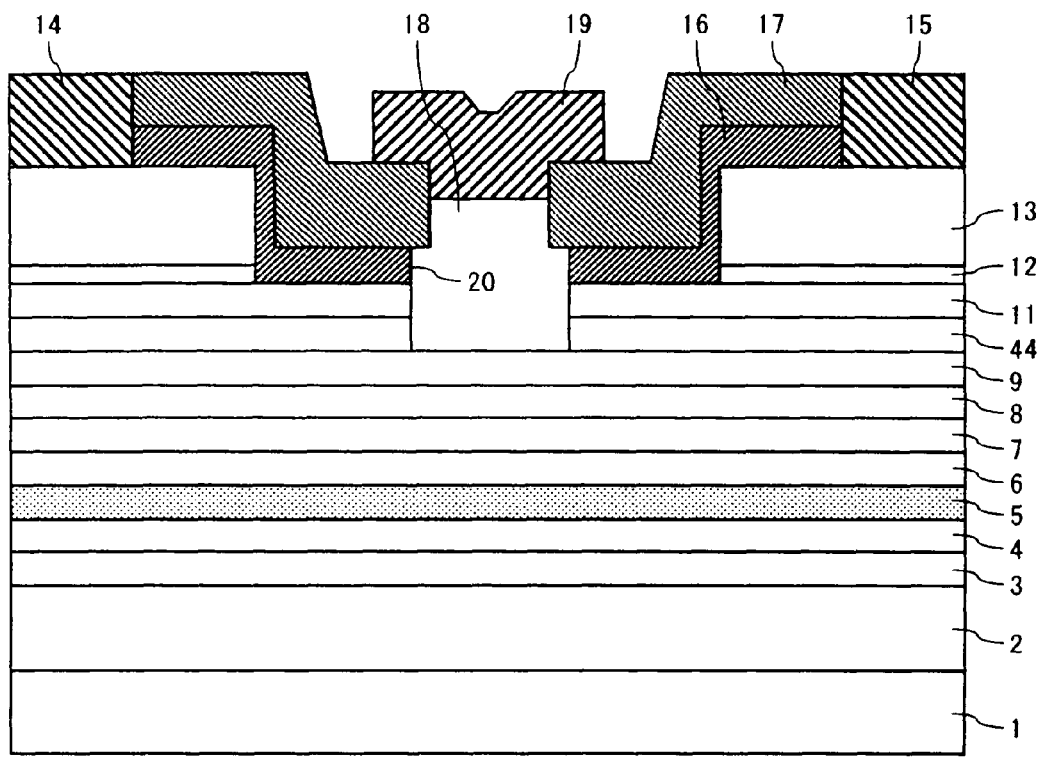
FIG. 15 is a cross-sectional view of a J-FET 64 according to a twelfth exemplary embodiment of the present invention.

The structure of a J-FET 64 according to an exemplary embodiment of the present invention is described hereinafter with reference to FIG. 15. FIG. 15 is a cross-sectional view of the J-FET 64 according to a twelfth exemplary embodiment of the present invention. In this exemplary embodiment, the structure of the semiconductor layer constituting the upper semiconductor layer in which the second recess is made is different from that of the first exemplary embodiment. The other structure is the same as that of the first exemplary embodiment and thus not repeatedly described.

As shown in FIG. 15, in this exemplary embodiment, an undoped AlGaAs stopper layer 44 is formed instead of the undoped InGaP stopper layer 10 of the J-FET 51 according to the first exemplary embodiment. Thus, the undoped AlGaAs layer 8, the undoped GaAs layer 9, the undoped AlGaAs stopper layer 44 and the undoped GaAs gate burying layer 11 constitute the upper semiconductor layer. The second recess is made in the undoped GaAs gate burying layer 11 and the undoped AlGaAs stopper layer 44. Therefore, the C-doped p$^+$-GaAs layer 18 is in contact with the undoped AlGaAs stopper layer 44 and the undoped GaAs gate burying layer 11 on the side surface of the second recess. In such a case also, the same advantages as in the first exemplary embodiment can be obtained.

Thirteenth Exemplary Embodiment

Figure 16:
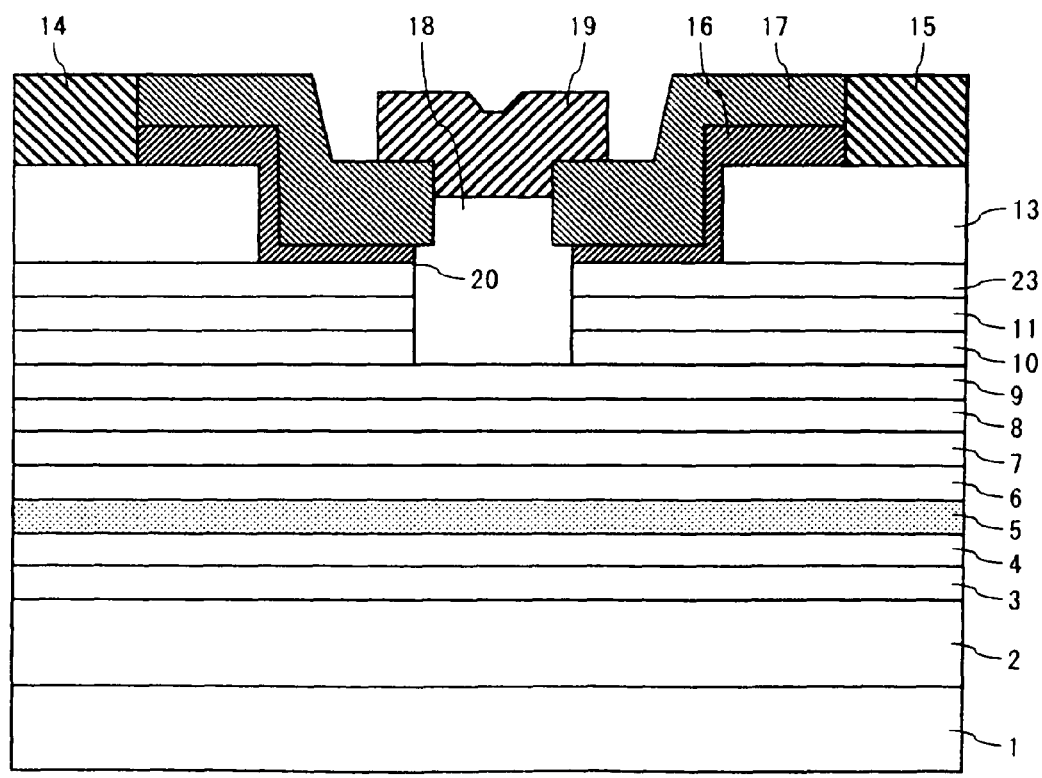
FIG. 16 is a cross-sectional view of a J-FET 65 according to a thirteenth exemplary embodiment of the present invention.

The structure of a J-FET 65 according to an exemplary embodiment of the present invention is described hereinafter with reference to FIG. 16. FIG. 16 is a cross-sectional view of the J-FET 65 according to a thirteenth exemplary embodiment of the present invention.

As shown in FIG. 16, in this exemplary embodiment, the undoped InGaP layer 23 is formed on the undoped GaAs gate burying layer 11. The second recess is made in the undoped InGaP layer 23, the undoped GaAs gate burying layer 11 and the undoped InGaP stopper layer 10. Thus, the C-doped p$^+$-GaAs layer 18 is in contact with the undoped InGaP stopper layer 10, the undoped GaAs gate burying layer 11 and the undoped InGaP layer 23 on the side surface of the second recess. In this case, the Si-doped n-type AlGaAs stopper layer 12 between the undoped InGaP layer 23 and the Si-doped n-type GaAs cap layer 13 may be eliminated. Therefore, the first recess is made in the Si-doped n-type GaAs cap layer 13. The other structure is the same as that of the first exemplary embodiment and thus not described. In such a case also, the same advantages as in the first exemplary embodiment can be obtained.

Fourteenth Exemplary Embodiment

Figure 17:
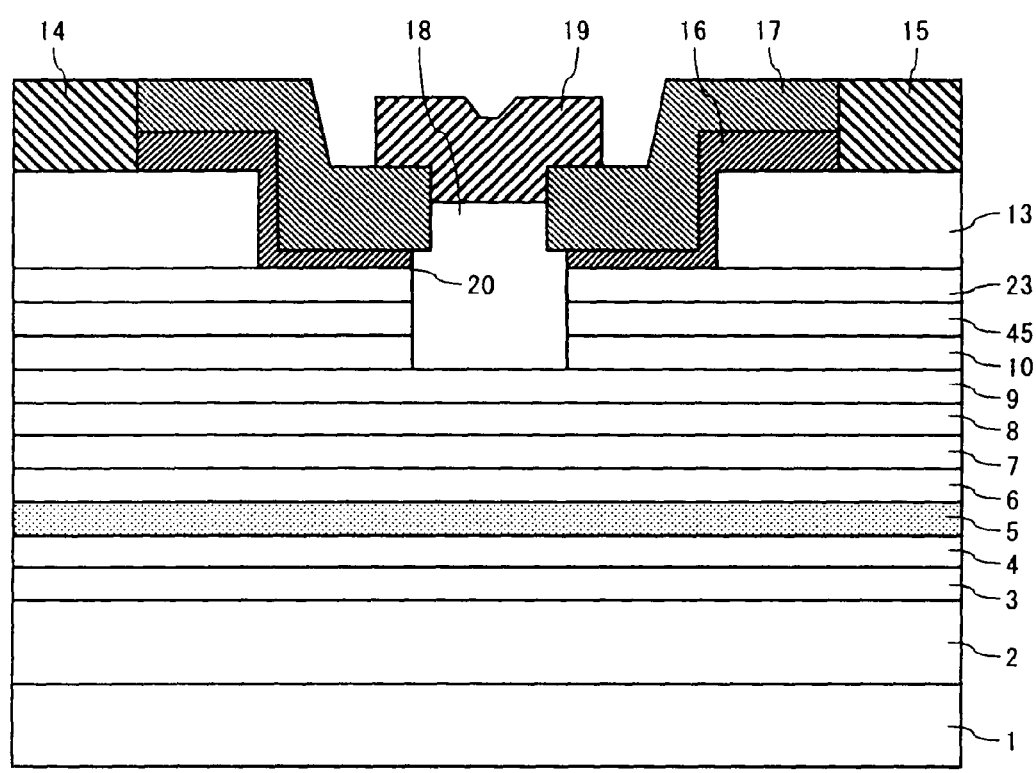
FIG. 17 is a cross-sectional view of a J-FET 66 according to a fourteenth exemplary embodiment of the present invention.

The structure of a J-FET 66 according to an exemplary embodiment of the present invention is described hereinafter with reference to FIG. 17. FIG. 17 is a cross-sectional view of the J-FET 66 according to a fourteenth exemplary embodiment of the present invention. In this exemplary embodiment, the structure of the semiconductor layer constituting the upper semiconductor layer in which the second recess is made is different from that of the thirteenth exemplary embodiment, and the other structure is the same as that of the thirteenth exemplary embodiment and thus not described below.

As shown in FIG. 17, in this exemplary embodiment, an undoped AlGaAs layer 45 is formed instead of the undoped GaAs gate burying layer 11 of the J-FET 65 according to the thirteenth exemplary embodiment. The second recess is made in the undoped InGaP layer 23, the undoped AlGaAs layer 45 and the undoped InGaP stopper layer 10. Thus, the C-doped p$^+$-GaAs layer 18 is in contact with the undoped InGaP stopper layer 10, the undoped AlGaAs layer 45 and the undoped InGaP layer 23 on the side surface of the second recess. In such a case also, the same advantages as in the first exemplary embodiment can be obtained.

Fifteenth Exemplary Embodiment

Figure 18:
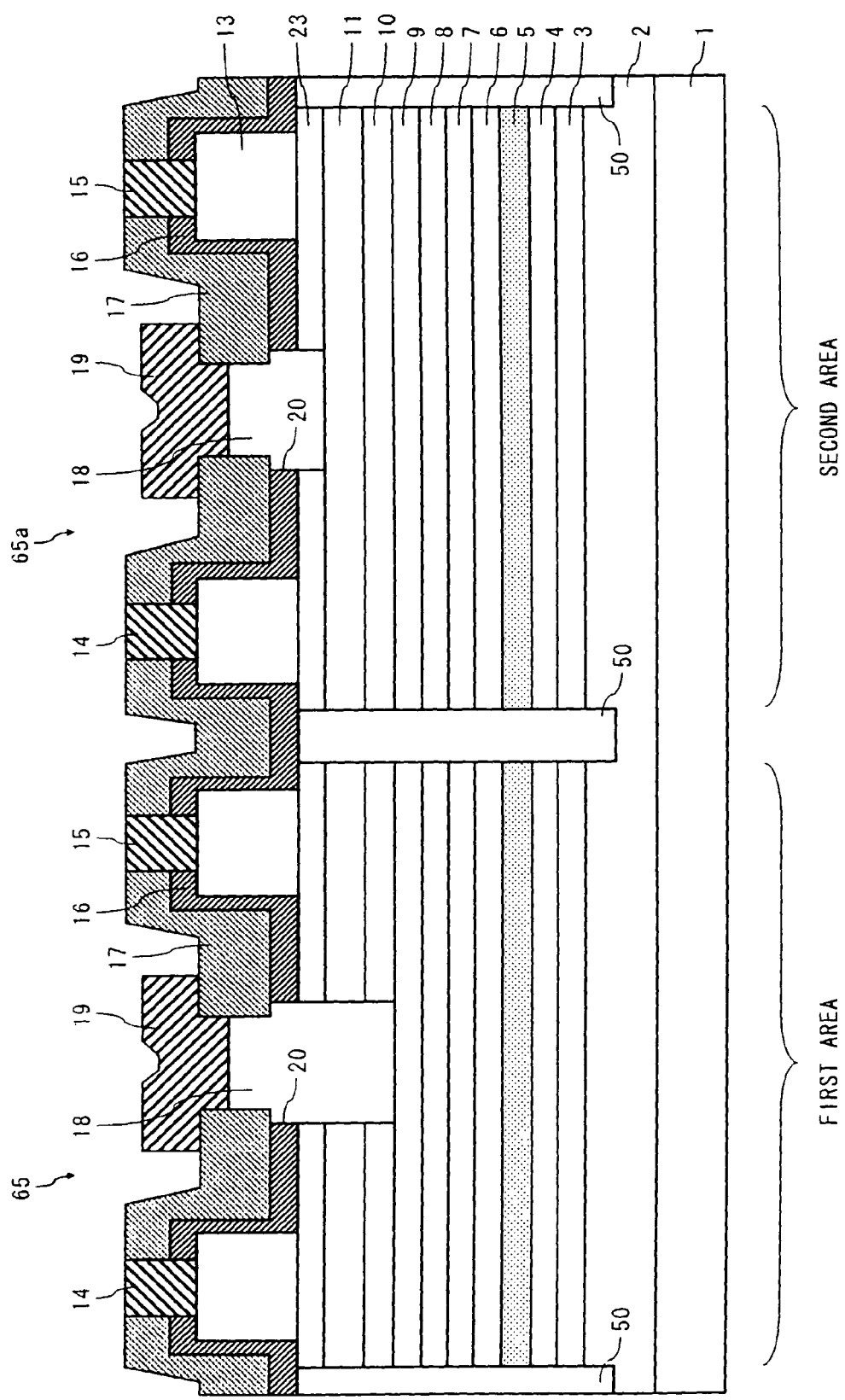
FIG. 18 is a cross-sectional view of a semiconductor device 71 according to a fifteenth exemplary embodiment of the present invention.

The structure of a semiconductor device 71 according to an exemplary embodiment of the present invention is described hereinafter with reference to FIG. 18. FIG. 18 is a cross-sectional view of the semiconductor device 71 according to a fifteenth exemplary embodiment of the present invention. In this exemplary embodiment, the gate insulating film of an exemplary embodiment of the present invention is applied to a semiconductor device in which a plurality of J-FETs are formed on one substrate.

Referring to FIG. 18, a J-FET is formed in each of the first area and the second area of the semiconductor device 71. On the semi-insulating GaAs substrate 1, the first area and the second area are electrically isolated by an isolation area 50. In this example, the J-FET 65 according to the thirteenth exemplary embodiment is formed in the first area of the semiconductor device 71. In the second area of the semiconductor device 71, a J-FET 65a in which the depth of the second recess is different from that of the J-FET 65 is formed.

Specifically, in the J-FET 65a, the second recess is made in the undoped InGaP layer 23. Thus, in the J-FET 65a, the C-doped p$^+$-GaAs layer 18 is in contact with the undoped InGaP layer 23 on the side surface of the second recess and in contact with the undoped GaAs gate burying layer 11 on the bottom surface of the second recess. On the other hand, the second recess of the J-FET 65 is made in the undoped InGaP layer 23, the undoped GaAs gate burying layer 11 and the undoped InGaP stopper layer 10 as described earlier.

As described above, in the semiconductor device of this exemplary embodiment, a plurality of J-FETs each having a selective regrowth p-n junction gate and the gate insulating film in a two-layer structure in which the nitride film 16 and the oxide film 17 are sequentially laminated on top of the upper semiconductor layer. It is thereby possible to obtain the semiconductor device that has the same advantages as in the first exemplary embodiment and provides high reliability with less threshold voltage shift before and after a voltage stress.

Sixteenth Exemplary Embodiment

Figure 19:
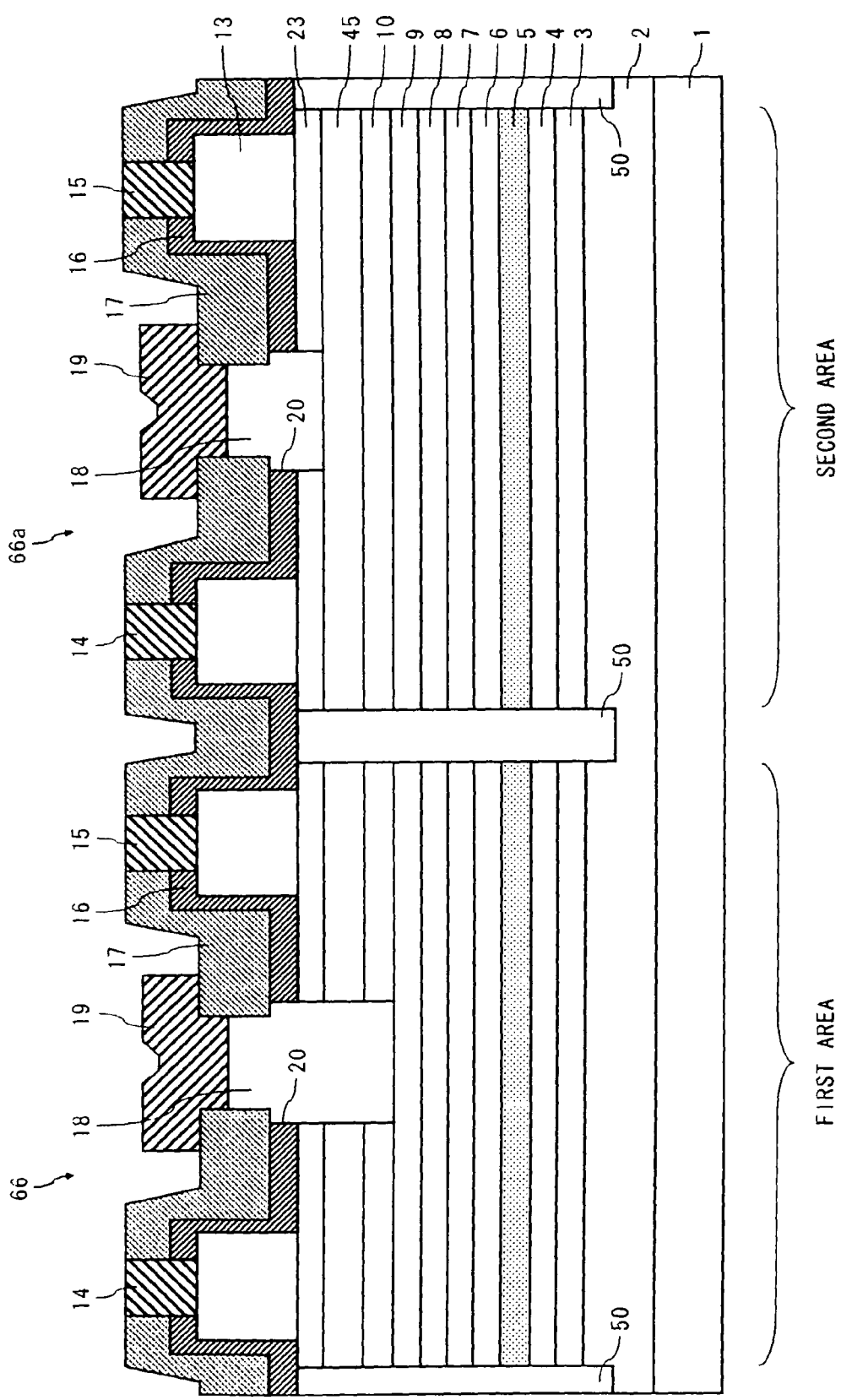
FIG. 19 is a cross-sectional view of a semiconductor device 72 according to a sixteenth exemplary embodiment of the present invention.

The structure of a semiconductor device 72 according to an exemplary embodiment of the present invention is described hereinafter with reference to FIG. 19. FIG. 19 is a cross-sectional view of the semiconductor device 72 according to a sixteenth exemplary embodiment of the present invention. In this exemplary embodiment, the structure of the upper semiconductor layer is different from that of the fifteenth exemplary embodiment. The other structure is the same as that of the thirteenth exemplary embodiment and thus not described below.

As shown in FIG. 19, in this exemplary embodiment, the undoped AlGaAs layer 45 is formed instead of the undoped GaAs gate burying layer 11 of the semiconductor device 71 according to the fifteenth exemplary embodiment. Specifically, the J-FET 66 according to the fourteenth exemplary embodiment is formed in the first area of the semiconductor device 72. In the second area of the semiconductor device 72, a J-FET 66a in which the depth of the second recess is different from that of the J-FET 66 is formed. In the J-FET 66a, the second recess is made in the undoped InGaP layer 23 just like the J-FET 65a of the semiconductor device 71 according to the fifteenth exemplary embodiment. Thus, in the J-FET 66a, the C-doped p$^+$-GaAs layer 18 is in contact with the undoped InGaP layer 23 on the side surface of the second recess and in contact with the undoped AlGaAs layer 45 on the bottom surface of the second recess. In such a case also, it is possible to obtain the semiconductor device that has the same advantages as in the first exemplary embodiment and provides high reliability with less threshold voltage shift before and after a voltage stress.

Seventeenth Exemplary Embodiment

Figure 20:
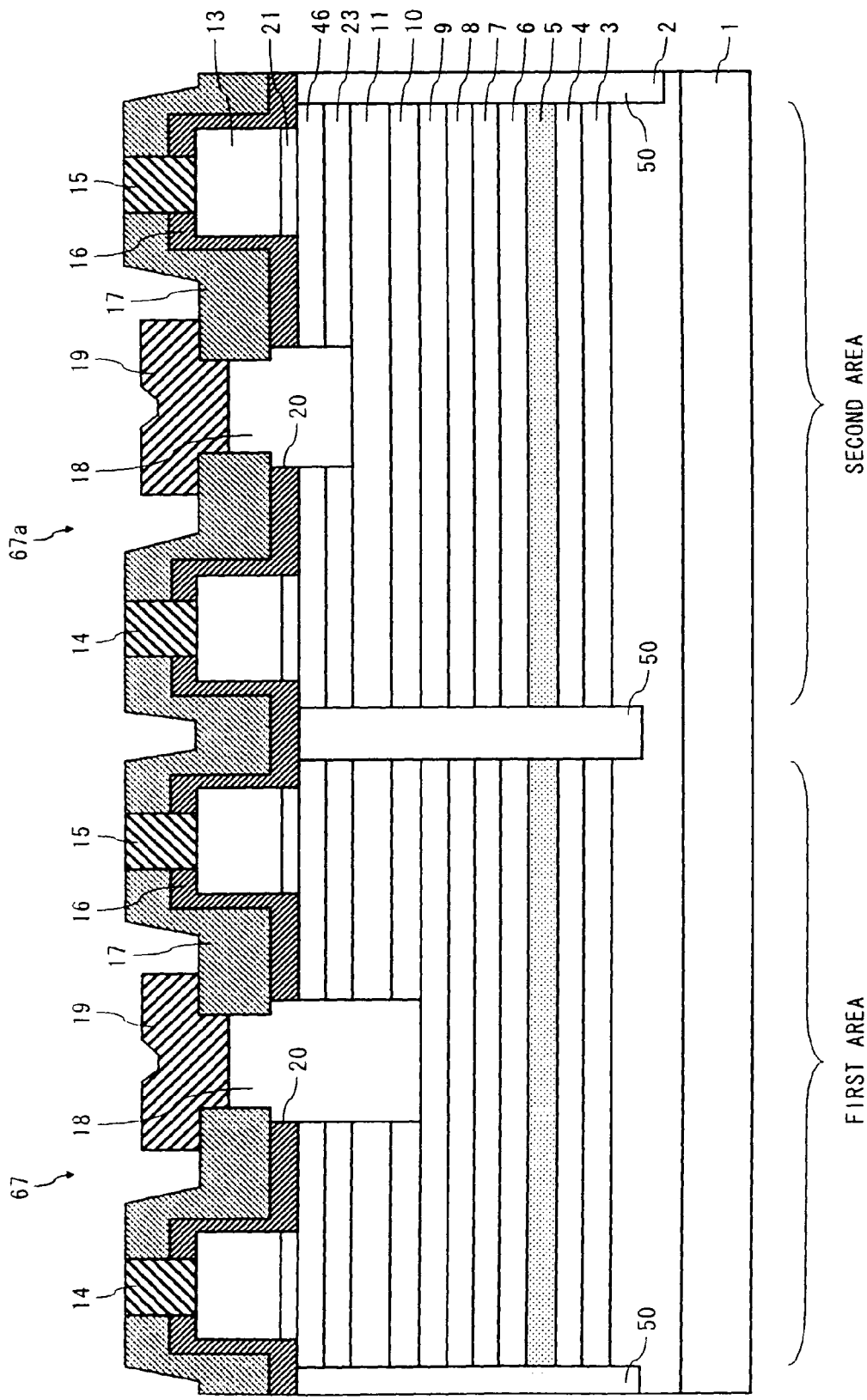
FIG. 20 is a cross-sectional view of a semiconductor device 73 according to a seventeenth exemplary embodiment of the present invention.

The structure of a semiconductor device 73 according to an exemplary embodiment of the present invention is described hereinafter with reference to FIG. 20. FIG. 20 is a cross-sectional view of the semiconductor device 73 according to a seventeenth exemplary embodiment of the present invention.

Referring to FIG. 20, in this exemplary embodiment, an undoped GaAs layer 46 and a Si-doped n-type InGaP stopper layer 21 are further formed between the undoped InGaP layer 23 and the Si-doped n-type GaAs cap layer 13 of the semiconductor device 71 according to the fifteenth exemplary embodiment. Thus, the upper semiconductor layer has a structure in which the undoped AlGaAs layer 8, the undoped GaAs layer 9, the undoped InGaP stopper layer 10, the undoped GaAs gate burying layer 11, the undoped InGaP layer 23 and the undoped GaAs layer 46 are sequentially laminated. Further, the first recess is made in the Si-doped n-type GaAs cap layer 13 and the Si-doped n-type InGaP stopper layer 21 above the upper semiconductor layer.

In the first area of the semiconductor device 73, a J-FET 67 in which the second recess is made in the undoped GaAs layer 46, the undoped InGaP layer 23, the undoped GaAs gate burying layer 11 and the undoped InGaP stopper layer 10 is formed. In the second area, a J-FET 67a in which the second recess is made only in the undoped GaAs layer 46 and the undoped InGaP layer 23 is formed. In such a case also, it is possible to obtain the semiconductor device that has the same advantages as in the first exemplary embodiment and provides high reliability with less threshold voltage shift before and after a voltage stress.

Eighteenth Exemplary Embodiment

Figure 21:
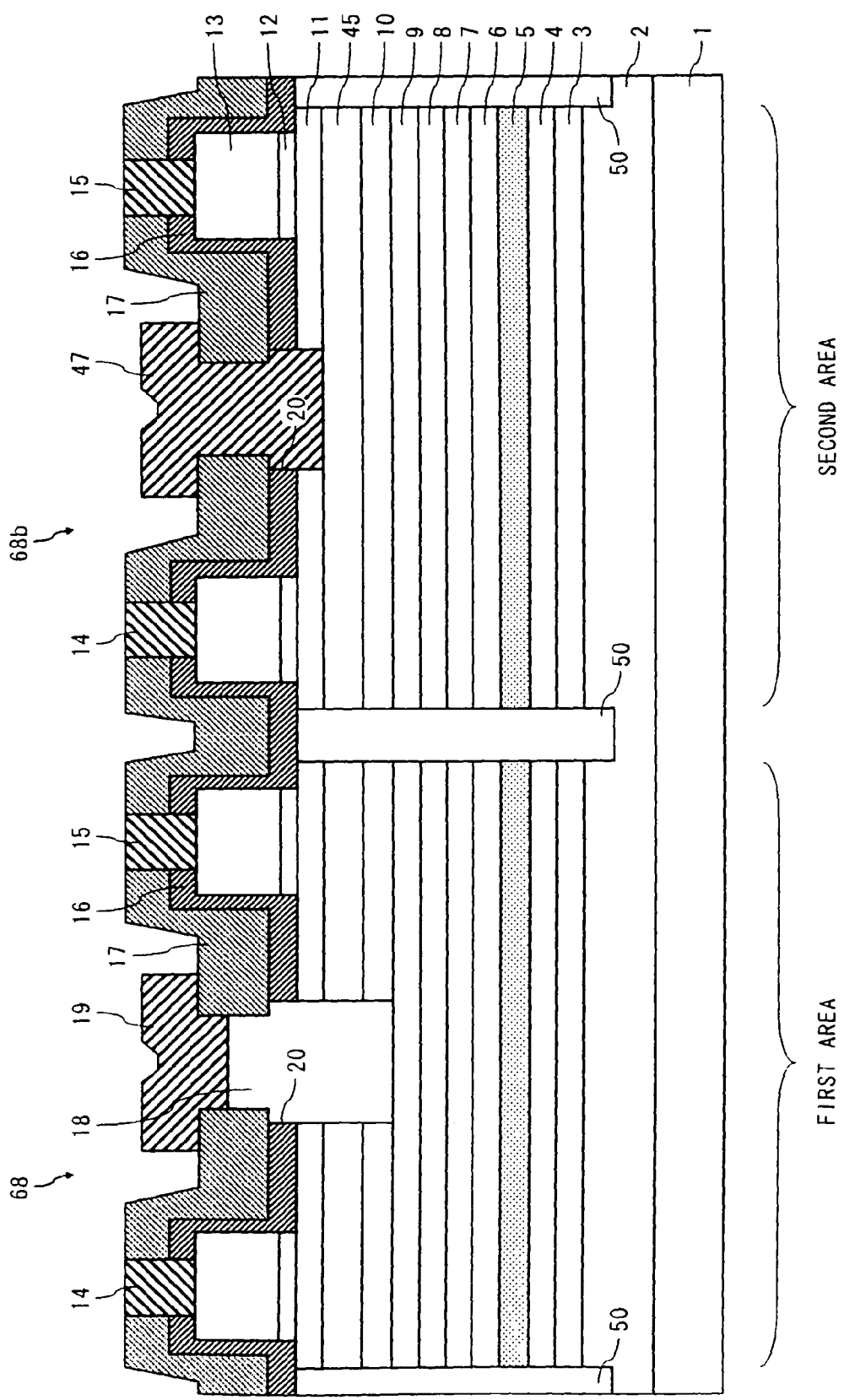
FIG. 21 is a cross-sectional view of a semiconductor device 74 according to an eighteenth exemplary embodiment of the present invention.
Figure 26:
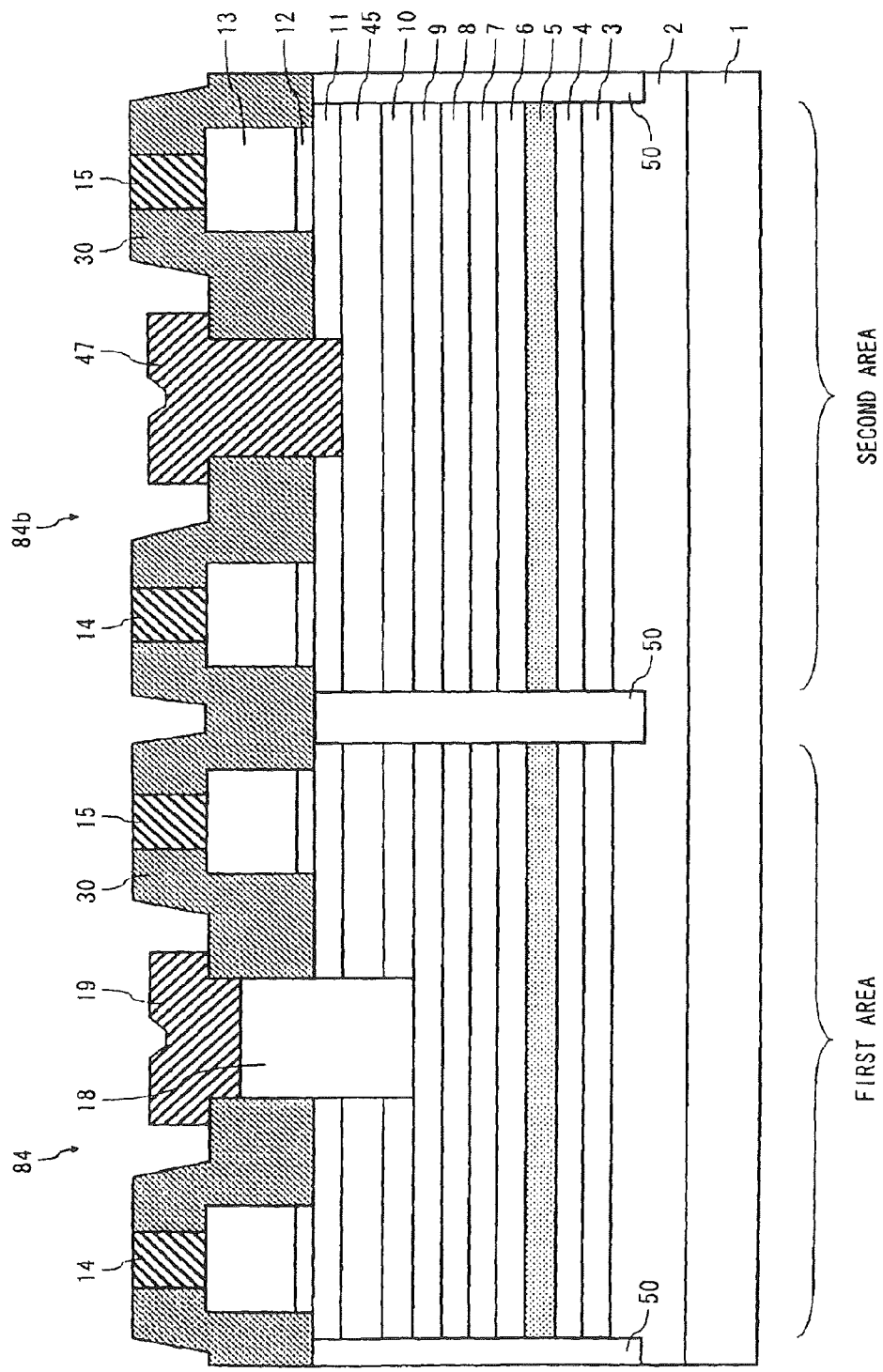
FIG. 26 is a cross-sectional view of a semiconductor device 91 according to related art.

The structure of a semiconductor device 74 according to an exemplary embodiment of the present invention is described hereinafter with reference to FIG. 21. FIG. 21 is a cross-sectional view of the semiconductor device 74 according to an eighteenth exemplary embodiment of the present invention. In this exemplary embodiment, the gate insulating film of an exemplary embodiment of the present invention is applied to a semiconductor device in which a J-FET is monolithic with a Schottky gate FET. In this exemplary embodiment, the structure of the gate insulating film is different from that of the semiconductor device 91 according to the related art shown in FIG. 26. The other structure is the same as that of the semiconductor device 91 according to the related art and thus not repeatedly described below.

Referring to FIG. 21, in the first area of the semiconductor device 74, a J-FET 68 having a p-n junction gate that is formed by selectively regrowing the C-doped p$^+$-GaAs layer 18 is placed. The gate insulating film of the J-FET 68 has a two-layer structure in which the nitride film 16 and the oxide film 17 are sequentially laminated on top of the upper semiconductor layer just like in the exemplary embodiments described above. The upper semiconductor layer has a structure in which the undoped AlGaAs layer 8, the undoped GaAs layer 9, the undoped InGaP stopper layer 10, the undoped AlGaAs layer 45 and the undoped GaAs gate burying layer 11 are sequentially laminated, as in the semiconductor device 91 according to the related art. In the J-FET 68, the second recess is made in the undoped GaAs gate burying layer 11, the undoped AlGaAs layer 45 and the undoped InGaP stopper layer 10, and the C-doped p$^+$-GaAs layer 18 is buried in the second recess.

In the second area that is electrically isolated from the first area by the isolation area 50, a Schottky gate FET 68b having a Schottky gate electrode 47 is formed. The Schottky gate electrode 47 is placed in contact with the upper semiconductor layer. Specifically, the second recess is made in the undoped GaAs gate burying layer 11, and the Schottky gate electrode 47 is in contact with the undoped AlGaAs layer 45 on the bottom surface of the second recess and in contact with the undoped GaAs gate burying layer 11 on the side surface of the second recess. In the Schottky gate FET 68b, the same gate insulating film as the one used in the J-FET 68 is used, which has a two-layer structure in which the nitride film 16 and the oxide film 17 are sequentially laminated on top of the upper semiconductor layer.

As described above, in the semiconductor device of this exemplary embodiment, the Schottky gate FET 68b is further formed on the same substrate as the J-FET 68 having a selective regrowth p-n junction gate in which the gate insulating film has a two-layer structure including the nitride film 16 and the oxide film 17 sequentially laminated on top of the upper semiconductor layer. The gate insulating film of the Schottky gate FET 68b also has a two-layer structure which is the same as the J-FET 68. It is thereby possible to obtain the semiconductor device that has the same advantages as in the first exemplary embodiment and provides high reliability with less threshold voltage shift before and after a voltage stress.

Nineteenth Exemplary Embodiment

Figure 22:
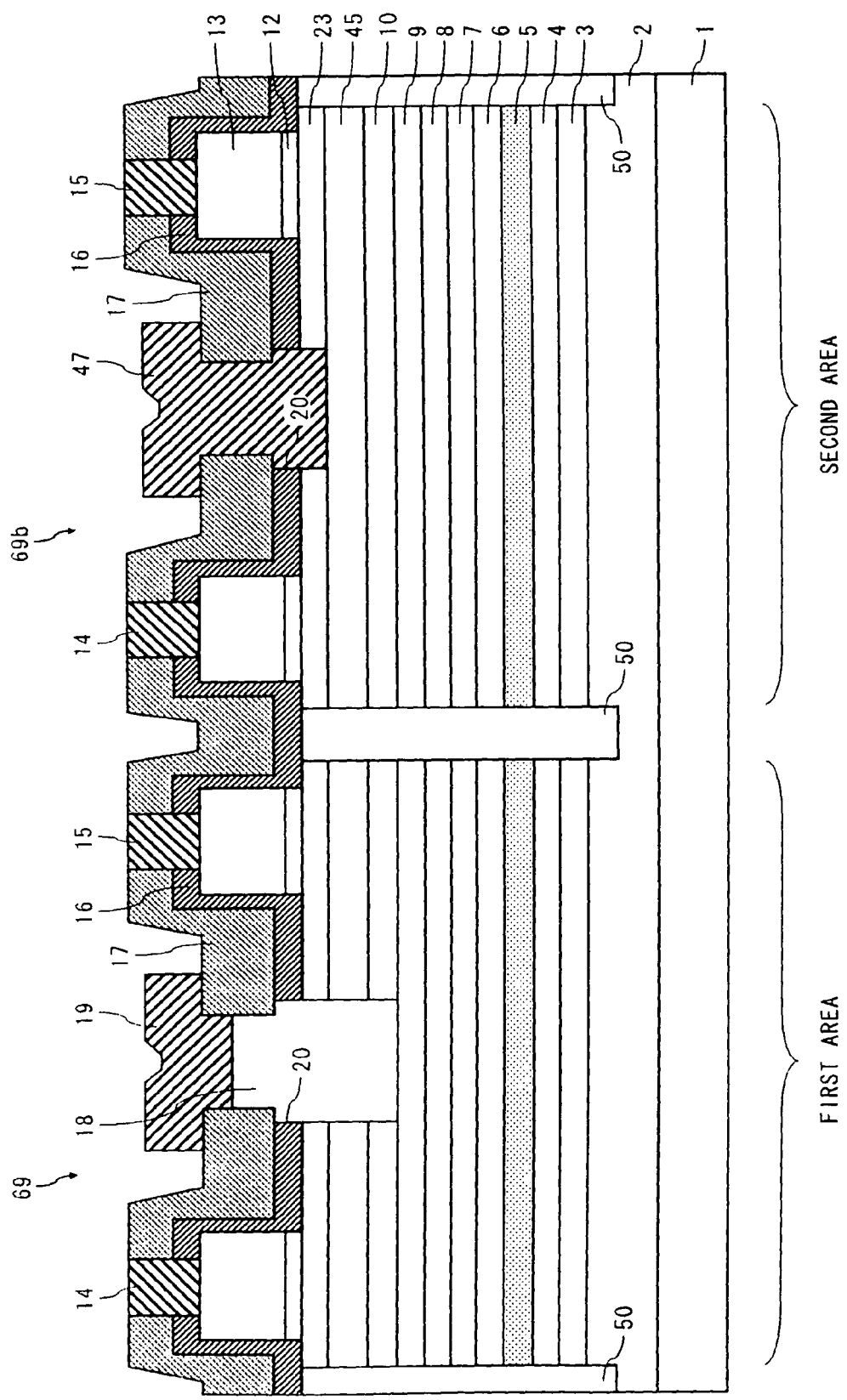
FIG. 22 is a cross-sectional view of a semiconductor device 75 according to a nineteenth exemplary embodiment of the present invention.
Figure 23:
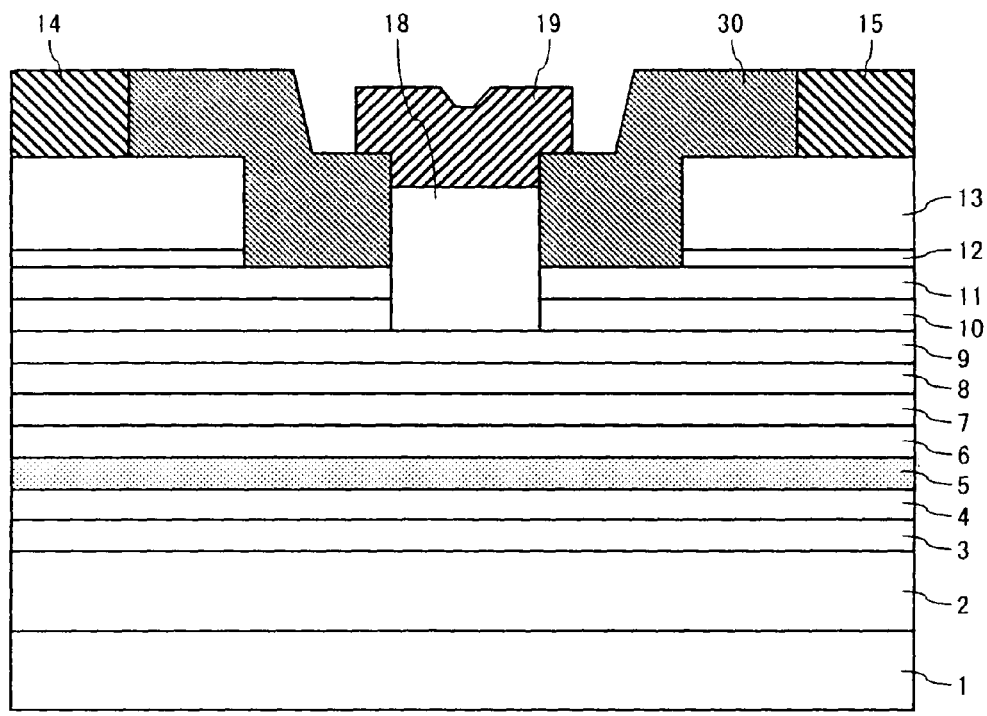
FIG. 23 is a cross-sectional view of a J-FET 81 according to prior art 1.
Figure 24:
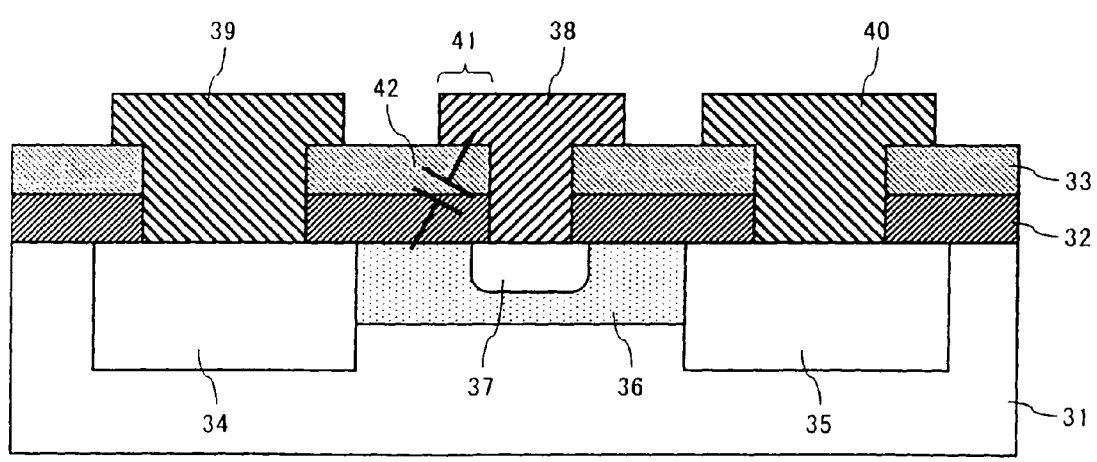
FIG. 24 is a cross-sectional view of a J-FET 82 according to prior art 2.
Figure 25:
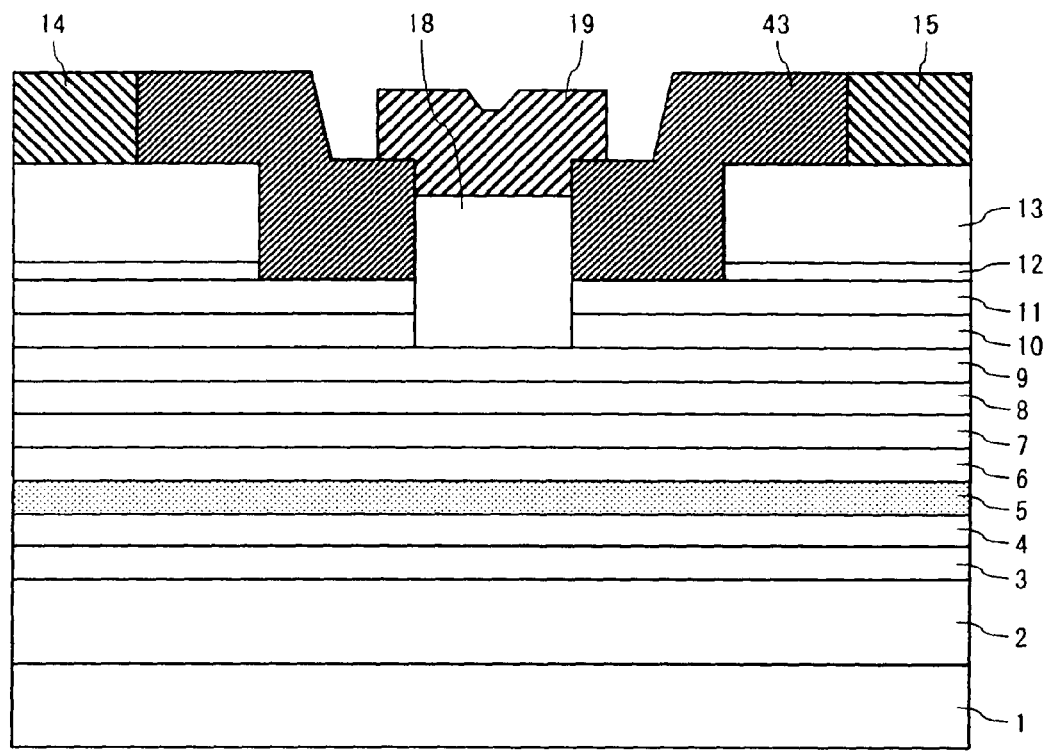
FIG. 25 is a cross-sectional view of a J-FET 83 according to prior art 3.

The structure of a semiconductor device 75 according to an exemplary embodiment of the present invention is described hereinafter with reference to FIG. 22. FIG. 22 is a cross-sectional view of the semiconductor device 75 according to a nineteenth exemplary embodiment of the present invention. In this exemplary embodiment, the structure of the upper semiconductor layer is different from that of the semiconductor device 74 according to the eighteenth exemplary embodiment. The other structure is the same as that of the semiconductor device 74 according to the eighteenth exemplary embodiment and thus not described below.

As shown in FIG. 22, in this exemplary embodiment, the undoped InGaP layer 23 is formed instead of the undoped GaAs gate burying layer 11 of the semiconductor device 74 according to the eighteenth exemplary embodiment. Thus, the upper semiconductor layer has a structure in which the undoped AlGaAs layer 8, the undoped GaAs layer 9, the undoped InGaP stopper layer 10, the undoped AlGaAs layer 45 and the undoped InGaP layer 23 are sequentially laminated.

In the first area of the semiconductor device 75, a J-FET 69 in which the second recess is made in the undoped InGaP layer 23, the undoped AlGaAs layer 45 and the undoped InGaP stopper layer 10 is formed. In the J-FET 69, the C-doped p$^+$-GaAs layer 18 is buried in the second recess. On the other hand, in the second area of the semiconductor device 75, a Schottky gate FET 69b in which the second recess is made in the undoped InGaP layer 23 is formed. In the Schottky gate FET 69b, the Schottky gate electrode 47 is in contact with the undoped AlGaAs layer 45 on the bottom surface of the second recess and in contact with the undoped InGaP layer 23 on the side surface of the second recess. In such a case also, it is possible to obtain the semiconductor device that has the same advantages as in the first exemplary embodiment and provides high reliability with less threshold voltage shift before and after a voltage stress.

The first to nineteenth exemplary embodiments can be combined as desirable by one of ordinary skill in the art. Further, although the case of using a GaAs J-FET that is fabricated using an epitaxial wafer by lattice matching on the semi-insulating GaAs substrate 1 is described in the foregoing by way of illustration, the present invention is not limited thereto, as long as it includes a channel layer of a first conductivity type formed above a semiconductor substrate, an upper semiconductor layer made up of at least one semiconductor layer formed above the channel layer of the first conductivity type, a semiconductor layer of a second conductivity type formed in a recess made in the upper semiconductor layer or formed above the upper semiconductor layer, a gate electrode placed above and in contact with the semiconductor layer of the second conductivity type, and a gate insulating film including a nitride film placed above and in contact with the upper semiconductor layer and an oxide film placed above the nitride film and having a larger thickness than the nitride film. For example, the same advantages can be obtained with use of an InP FET or a GaN FET with the semiconductor layer containing Ga exposed on the surface.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A field effect transistor, comprising:
   a channel layer of a first conductivity type formed above a semiconductor substrate;
   an upper semiconductor layer comprising at least one semiconductor layer and formed above the channel layer of the first conductivity type;
   a semiconductor layer of a second conductivity type formed in a recess made in the upper semiconductor, layer or formed above the upper semiconductor layer;
   a gate electrode placed above and in contact with the semiconductor layer of the second conductivity type; and
   a gate insulating film including a nitride film formed above and in direct contact with the at least one semiconductor a gate insulating film including a nitride film formed above and in direct contact with the at least one semiconductor layer and an oxide film formed above the nitride film and having a layer and an oxide film formed above the nitride film and having a larger thickness than a thickness of the nitride film,
   wherein the semiconductor layer of the second conductivity type is buried in an opening formed in the gate insulating film, and
   wherein a side surface of the oxide film projects towards the semiconductor layer of the second conductivity type as compared with a side surface of the nitride film.

2. The field effect transistor according to claim 1, wherein a thickness of the nitride film is equal to or smaller than 100 nm.

3. The field effect transistor according to claim 1, wherein a thickness of the gate insulating film is equal to or larger than 200 nm.

4. The field effect transistor according to claim 1, wherein a semiconductor layer constituting the upper semiconductor layer and located at an uppermost position of the upper semiconductor layer comprises Ga.

5. The field effect transistor according to claim 1, wherein the upper semiconductor layer comprises a plurality of undoped layers.

6. The field effect transistor according to claim 1, wherein the second conductivity type is different from the first conductivity type.

7. The field effect transistor according to claim 1, wherein an impurity concentration in the semiconductor layer of the second conductivity type is more than an impurity concentration in the channel layer of the first conductivity type.

8. The field effect transistor according to claim 1, wherein the oxide film abuts the semiconductor layer of the second conductivity type.

9. The field effect transistor according to claim 1, wherein the channel layer comprises:
   an undoped layer,
   a pair of spacer layers disposed on opposing surfaces of the undoped layer; and
   a pair of electron supply layers disposed on surfaces of the pair of spacer layers, respectively.

10. The field effect transistor according to claim 1, wherein a gate of the field effect transistor comprises the semiconductor layer of the second conductivity type and the gate electrode.

11. The field effect transistor according to claim 1, wherein the gate electrode abuts the semiconductor layer of the second conductivity type.

12. The field effect transistor according to claim 1, wherein the semiconductor layer of the second conductivity type is formed under the gate electrode.

13. The field effect transistor according to claim 1, wherein, in a plan view, the semiconductor layer of the second conductivity type is confined inside the gate electrode.

14. The field effect transistor according to claim 1, further comprising:
   a source electrode; and
   a drain electrode,
   wherein the semiconductor layer of the second conductivity type is located between the source electrode and the drain electrode.

15. The field effect transistor according to claim 14, wherein, in a plan view, the semiconductor layer of the second conductivity type is confined between the source electrode and the drain electrode.

16. The field effect transistor according to claim 1, wherein the semiconductor layer of the second conductivity type is doped with carbon.

17. The field effect transistor according to claim 1, wherein the semiconductor layer of the second conductivity type comprises GaAs doped with carbon.

18. The field effect transistor according to claim 1, wherein a bottom surface of the gate electrode is formed below a bottom surface of the oxide film.

* * * * *